(12) United States Patent
Saito et al.

(10) Patent No.: US 9,784,627 B2
(45) Date of Patent: Oct. 10, 2017

(54) LOAD SENSOR, LOAD DETECTOR INCLUDING LOAD SENSOR, AND METHOD FOR DETECTING LOAD

(71) Applicant: PANASONIC INTELLECTUAL PROPERTY MANAGEMENT CO., LTD., Osaka (JP)

(72) Inventors: Fumitaka Saito, Osaka (JP); Masahisa Niwa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 407 days.

(21) Appl. No.: 14/531,595

(22) Filed: Nov. 3, 2014

(65) Prior Publication Data

US 2015/0143923 A1    May 28, 2015

(30) Foreign Application Priority Data

Nov. 27, 2013  (JP) ................... 2013-245190
May 27, 2014   (JP) ................... 2014-109415

(51) Int. Cl.

| G01L 1/12 | (2006.01) |
|---|---|
| G01L 1/25 | (2006.01) |
| G01L 1/00 | (2006.01) |
| G01L 1/04 | (2006.01) |
| H01L 41/12 | (2006.01) |

(52) U.S. Cl.
CPC ............ G01L 1/125 (2013.01); H01L 41/125 (2013.01)

(58) Field of Classification Search
None
See application file for complete search history.

(56) References Cited

U.S. PATENT DOCUMENTS

| 3,299,382 A | 1/1967 | Tanaka et al. |
| 3,681,982 A * | 8/1972 | Hiratsuka ............... G01L 1/127 |
| | | 73/862.69 |
| 3,717,039 A | 2/1973 | Zinker |
| 4,048,851 A | 9/1977 | Portier |
| 4,138,783 A | 2/1979 | Portier |

(Continued)

FOREIGN PATENT DOCUMENTS

| EP | 992777 | 4/2000 |
| JP | 50-047667 | 4/1975 |

(Continued)

OTHER PUBLICATIONS

International Search Report of PCT application No. PCT/JP2015/002644 dated Jun. 30, 2015.

(Continued)

*Primary Examiner* — Peter Macchiarolo
*Assistant Examiner* — Jermaine Jenkins
(74) *Attorney, Agent, or Firm* — McDermott Will & Emery LLP

(57) ABSTRACT

A load sensor includes a core having a hollow part provided therein and containing magnetic material and a coil attached to the core. A magnetic path along which a magnetic flux generated by a current flowing in the coil is formed along a circumference direction of the hollow part. The core has a load-receiving portion that receives a load at a surface of the core located in a crossing direction crossing a plane along which the magnetic path is formed.

37 Claims, 30 Drawing Sheets

(56) References Cited

U.S. PATENT DOCUMENTS

| | | | |
|---|---|---|---|
| 4,561,314 A | 12/1985 | Alley et al. | |
| 5,142,906 A | 9/1992 | Smith | |
| 5,165,286 A * | 11/1992 | Hamamura | G01L 3/102 73/779 |
| 5,230,247 A | 7/1993 | Ngo et al. | |
| 5,297,430 A | 3/1994 | Sonderegger et al. | |
| 5,359,902 A * | 11/1994 | Barger | G01L 1/14 73/779 |
| 6,422,089 B1 * | 7/2002 | Madden | G01G 3/12 73/779 |
| 6,752,029 B2 * | 6/2004 | Madden | G01G 3/12 73/862.69 |
| 2008/0168844 A1 | 7/2008 | Lequesne et al. | |
| 2008/0290861 A1 | 11/2008 | Niwa et al. | |

FOREIGN PATENT DOCUMENTS

| | | |
|---|---|---|
| JP | 50-065863 | 6/1975 |
| JP | 52-007739 B | 3/1977 |
| JP | 60-122341 A | 6/1985 |
| JP | 61-100117 U | 6/1986 |
| JP | 61-170627 A | 8/1986 |
| JP | 1-148928 | 6/1989 |
| JP | 1-311236 | 12/1989 |
| JP | 2-061530 | 3/1990 |
| JP | 2-259538 | 10/1990 |
| JP | 4-025212 U | 2/1992 |
| JP | 4-231827 | 8/1992 |
| JP | 04-127535 U | 11/1992 |
| JP | 5-501765 | 4/1993 |
| JP | 6-074942 | 3/1994 |
| JP | 6-031111 U | 4/1994 |
| JP | 06-074942 U | 10/1994 |
| JP | 10-002810 | 1/1998 |
| JP | 10-106871 | 4/1998 |
| JP | 11-248559 A | 9/1999 |
| JP | 2000-114616 | 4/2000 |
| JP | 2000-171289 | 6/2000 |
| JP | 2002-098603 A | 4/2002 |
| JP | 2002-217049 | 8/2002 |
| JP | 2002-365151 | 12/2002 |
| JP | 2003-057128 A | 2/2003 |
| JP | 2003-194639 A | 7/2003 |
| JP | 2004-226196 A | 8/2004 |
| JP | 2005-180950 | 7/2005 |
| JP | 2005-249656 | 9/2005 |
| JP | 2006-162511 A | 6/2006 |
| JP | 3128065 U | 12/2006 |
| JP | 2008-070205 | 3/2008 |
| JP | 2008-082712 | 4/2008 |
| JP | 2008-292376 A | 12/2008 |
| JP | 2012-065453 | 3/2012 |

OTHER PUBLICATIONS

International Search Report of PCT application No. PCT/JP2015/002645 dated Jun. 30, 2015.

* cited by examiner

LOAD SENSOR, LOAD DETECTOR INCLUDING LOAD SENSOR, AND METHOD FOR DETECTING LOAD

RELATED APPLICATIONS

This application claims the benefit of Japanese Application No. 2013-245190, filed on Nov. 27, 2013 and Japanese Application No. 2014-109415, filed on May 27, 2014, the disclosures of which Applications are incorporated by reference herein.

TECHNICAL FIELD

The present disclosure relates to a load sensor, a load detector including the load sensor, and a method for detecting a load.

BACKGROUND ART

Japanese Patent Laid-Open Publication No. 2004-226196 discloses a conventional magnetostrictive load sensor that detects a load applied to a magnetic body magnetized by a current flowing through a coil, based on change in the magnetic permeability according to strain of the magnetic body. The magnetostrictive load sensor includes a ferromagnetic load-receiving portion that receives an external load, a coil wound around the load-receiving portion, and a ferromagnetic case that accommodates the load-receiving portion and the coil therein. The coil is held in a bobbin disposed around the load-receiving portion and containing a resin.

The load-receiving portion has a rod shape, and has a cylindrical hollow part in an axisymmetric area including the longitudinal center axis of the load-receiving portion. A rod-shaped component, such as a wire or a cable, is inserted into the hollow part. The load-receiving portion receives a load applied in the axial direction of the rod-shaped component.

When the load is applied to the load-receiving portion, the magnetic permeability of the load-receiving portion changes by the inverse magnetostriction effect, and accordingly changes the impedance of the circuit including the inductance of the coil. The magnetostrictive load sensor detects a load caused by the movement of the rod-shaped component inserted into the hollow part of the load-receiving portion, by measuring the voltage change across the coil that is caused by the change in the impedance.

Japanese Utility Model Laid-Open Publication No. 6-74942 discloses a conventional load sensor that detects a load using a strain gauge. The load sensor includes a rim fixer that is annular-shaped in the plan view, a load applicator at the center of the inside of the rim fixer, and strain generators that link the rim fixer and the load applicator. The strain gauge is adhered to each of the strain generators. Each of the strain gauges detects the load applied to the load applicator, and converts the load into an electric signal.

FIG. 29 is a schematic view of conventional load sensor 500 disclosed in Japanese Patent Laid-Open Publication No. 2003-194639. Load sensor 500 includes two cores 501, magnetostriction component 502, exciting coil 503, and detection coil 504.

Cores 501 extend in longitudinal direction D500. Core legs 501A are integrally formed in respective ends of cores 501 in longitudinal direction D500. Gaps 505 are provided between core legs 501A of one of cores 501 and core legs 501A of the other of cores 501. Magnetostriction component 502 contains a magnetic material, is cylindrical, and is held between two cores 501. Exciting coil 503 is wound around one of core legs 501A of each of cores 501. With application of AC, magnetic flux is generated between cores 501 and magnetostriction component 502. Detection coil 504 is wound around the other of core legs 501A of each of cores 501, and detects the magnetic flux that passes through each of cores 501.

An operation of load sensor 500 will be described below. An alternating-current (AC) current flowing in exciting coil 503 forms two paths, that is, magnetic path M502 of the magnetic flux that passes through core legs 501A and gaps 505, and magnetic path M503 of the magnetic flux that passes through core legs 501A, one of gaps 505, and magnetostriction component 502. When load F500 for holding down magnetostriction component 502 in the axial direction is applied to one of cores 501, load F500 is transmitted to magnetostriction component 502 through core 501, compresses magnetostriction component 502. Here, an increase in load F500 increases the magnetic resistance of magnetic path M503 and decreases the magnetic resistance of magnetic path M502. Thus, the magnetic flux that passes through magnetic path M502 increases. Accordingly, since the magnetic flux detected by detection coil 504 increases, the voltage induced by detection coil 504 increases. Load sensor 500 can calculate load F500 based on the voltage induced by detection coil 504.

The above conventional sensors have difficulties in reducing their thicknesses.

SUMMARY

A load sensor includes a core having a hollow part provided therein and containing magnetic material and a coil attached to the core. A magnetic path along which a magnetic flux generated by a current flowing in the coil is formed along a circumference direction of the hollow part. The core has a load-receiving portion that receives a load at a surface of the core located in a crossing direction crossing a plane along which the magnetic path is formed.

This load sensor may have a thin size

DETAILED DESCRIPTION OF PREFERRED EMBODIMENTS

Exemplary Embodiment 1

Figure 1A:
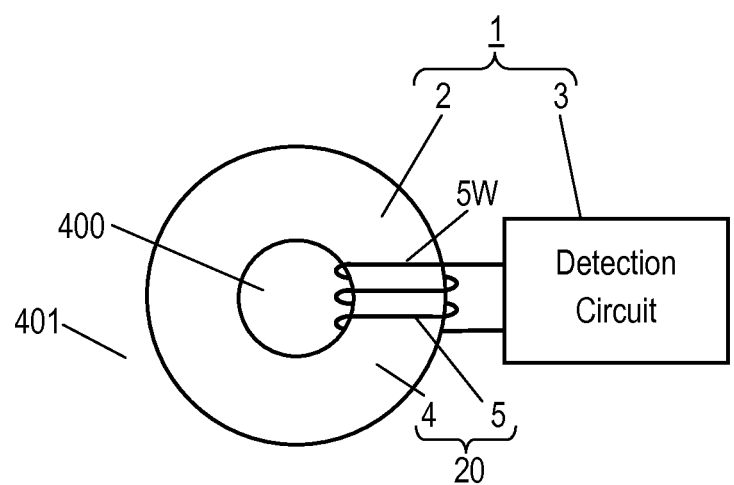
FIG. 1A is a schematic view of a load detector according to Exemplary Embodiment 1.

FIG. 1A is a schematic view of load detector 1 according to Exemplary Embodiment 1. Load detector 1 includes load sensor 2 and detection circuit 3.

Figure 1B:
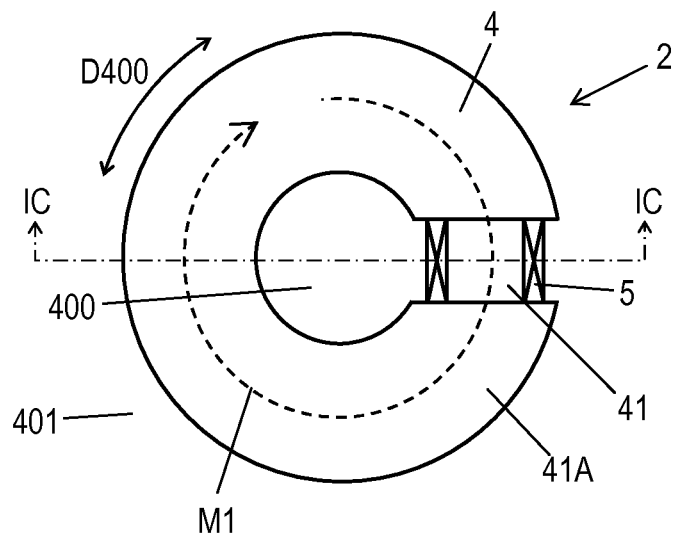
FIG. 1B is a schematic plan view of the load sensor according to Embodiment 1.
Figure 1C:
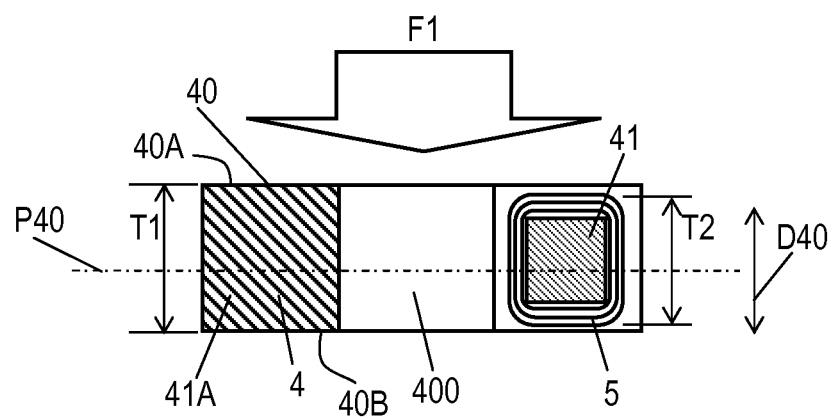
FIG. 1C is a schematic cross-sectional view of the load sensor at line IC-IC shown in FIG. 1B.

FIG. 1B is a schematic plan view of load sensor 2. FIG. 1C is a schematic cross-sectional view of load sensor 2 at line IC-IC shown in FIG. 1B. Load sensor 2 includes core 4 made of magnetic material and coil 5 attached to core 4. Core 4 has hollow part 400. Magnetic path M1 along which magnetic flux generated by a current flowing in coil 5 passes is formed along a circumference direction D400 of hollow part 400. Core 4 has load-receiving portion 40 provided at surface 40A of core 40 located in crossing direction D40 crossing a plane having magnetic path M1 formed thereon. Load-receiving portion 40 is configured to receive load F1. Core 4 and coil 5 constitute detecting unit 20 that detects load F1. Core 4 has surface 4B opposite to surface 4A.

Detection circuit 3 detects the load applied to load-receiving portion 40, based on a change in the inductance or conductance of coil 5.

In a method of detecting a load according to Embodiment 1, a current is supplied to coil 5 of load sensor 2 according to Embodiment 1. In a method of detecting a load according to Embodiment 1, the load applied to load-receiving portion 40 is detected based on a change in the inductance or conductance of coil 5. Load sensor 2 according to Embodiment 1, load detector 1 including load sensor 1, and the method of detecting a lord will be detailed below.

Core 4 is made of magnetic material, such as Ni(nickel)-Zn(zinc) ferrite, and has an annular shape. Core 4 is made of magnetic material exhibiting an inverse magnetostriction effect with load F1 applied to core 4. The inverse magnetostriction effect is an effect by which magnetized core 4 is mechanically strained with the applied load and the magnetic permeability of core 4 is changed with the strain. That is, core 4 has a loop shape surrounding hollow part 400. According to Embodiment 1, core 4 has an annular shape.

Coil 5 is formed by winding lead wire 5W on core 4 such that lead wire 5W repetitively passes alternately through hollow part 400 and outside 401. Lead wire 5W is preferably made of a copper wire, such as an enameled wire, covered with an insulating material wire. In the description below, a part of core 4 having lead wire 5W wound thereon (having coil 5 attached thereto) is attachment part 41. Core 4 having the loop shape separates hollow part 400 from outside 401. Coil 5 includes lead wire 5W wound on core 4 so as to repetitively pass alternately through hollow part 400 and outside 401. Lead wire 5W includes a copper wire and an insulating material covering the copper wire. Core 4 includes attachment part 41 having lead wire 5W wound thereon and having coil 5 attached thereto.

As illustrated in FIG. 1B, the magnetic flux passes inside core 4 when a current flows in coil 5. This forms magnetic path M1 (magnetic circuit) along circumferential direction D400 of hollow part 400. Magnetic path M1 is a closed magnetic path.

Core 4 has load-receiving portion 40 provided at a surface (an upper surface shown in FIG. 1C) of core 4 in a thickness direction (a vertical direction in FIG. 1C) thereof. That is, core 4 has load-receiving portion 40 provided at surface 40A in a direction perpendicular to plane P40 having magnetic path M1 formed thereon. Here, the term, "perpendicular" means not only completely perpendicular but also substantially perpendicular.

Figure 2A:
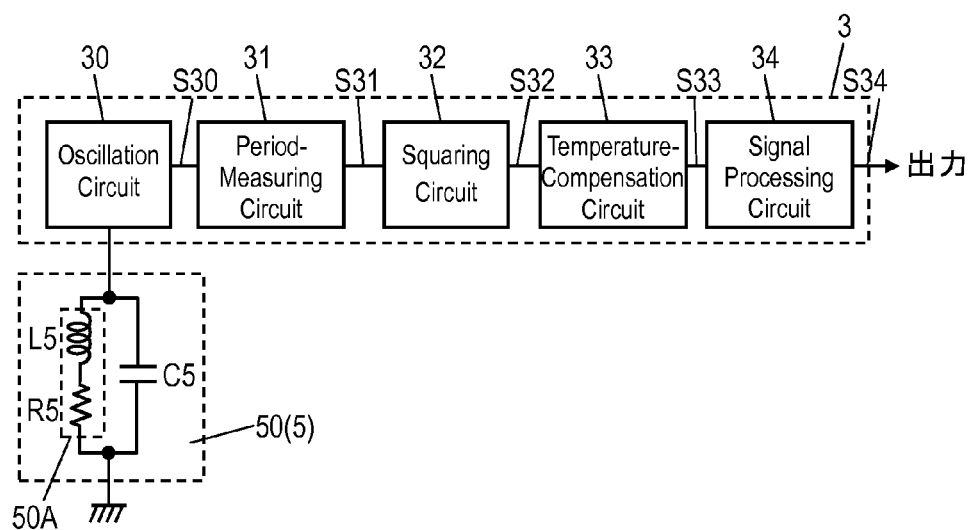
FIG. 2A is a block diagram of a detection circuit of the load detector according to Embodiment 1.

FIG. 2A is a block diagram of detection circuit 3. Detection circuit 3 includes oscillating circuit 30, period-measuring circuit 31, squaring circuit 32, temperature-compensation circuit 33, and signal processing circuit 34. Oscillating circuit 30 maintains the oscillation of resonance circuit 50 including coil 5. Oscillating circuit 30 oscillates at a frequency corresponding to the resonance frequency of resonance circuit 50, and outputs oscillation signal S30 having the frequency. Period-measuring circuit 31 measures a period of oscillation signal S30 output from oscillating circuit 30, and outputs signal S31 corresponding to the measured period. Squaring circuit 32 generates a square value of signal S31 output from period-measuring circuit 31 and output the value as signal S32. Temperature-compensation circuit 33 reduces fluctuations of signal S32 output from squaring circuit 32 against temperature by a temperature-compensation process, and outputs signal S33. Signal processing circuit 34 outputs signal S34 corresponding to load F1 applied to load-receiving portion 40 of core 4, based on signal S33 output from temperature-compensation circuit 33 to detect change in load F1.

As illustrated in FIG. 2A, an equivalent circuit of resonance circuit 50 includes serial assembly 50A including inductor L5 and resistor R5 connected in series to each other, and capacitor C5 coupled in parallel to serial assembly 50A. The inductance of inductor L5 is equivalent to the inductance of coil 5. The resistance of resistor R5 is equivalent to the resistance of lead wire 5W of coil 5. The capacitance of capacitor C5 is equivalent to a parasitic capacitance of coil 5. In other words, in load detector 1 according to Embodiment 1, only coil 5 constitutes resonance circuit 50. Resonance circuit 50 may further include another capacitor coupled in parallel to coil 5. In this case, the capacitance of capacitor C5 is equivalent to a combined value of the parasitic capacitance of coil 5 and the capacitance of the capacitor coupled in parallel to coil 5.

A method for detecting a load will be described according to Embodiment 1. In the method of detecting a load according to Embodiment 1, a current is supplied to coil 5. In the method of detecting a load according to Embodiment 1, a load applied to load-receiving portion 40 in crossing direction D40 (a vertical direction D40 in FIG. 1C) is detected based on a change of the inductance of coil 5. The method will be described below by explaining an operation of load detector 1 according to Embodiment 1.

First, an external power supply of load sensor 2 supplies a current to coil 5. Oscillating circuit 30 of detection circuit 3 supplies the current to coil 5. Then, core 4 is magnetized by the magnetic flux generated with the current supplied to coil 5 to form magnetic path M1 in core 4 illustrated in FIG. 1B. In this state, load F1 is applied to load-receiving portion 40 of core 4 in a direction of press core 4, and changes the magnetic permeability of core 4 by an inverse magnetostriction effect according to the amount of load F1. The inductance of coil 5 changes according to the change in the magnetic permeability of core 4.

Figure 2B:
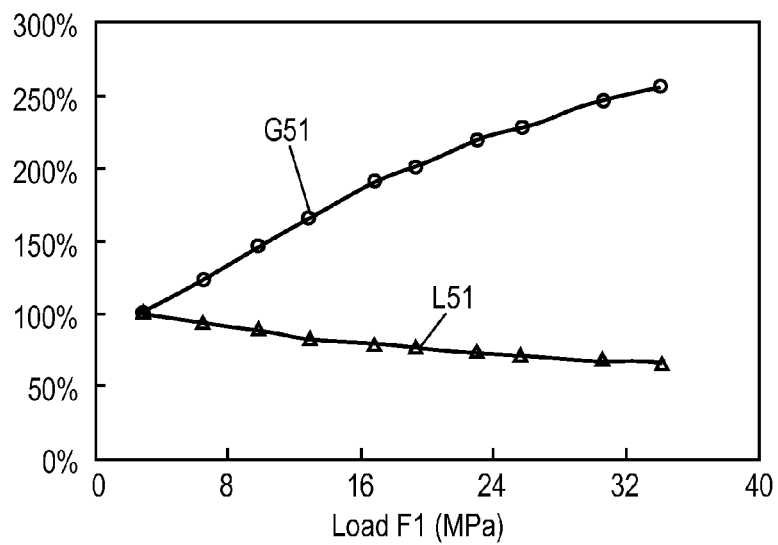
FIG. 2B indicates a relationship between a load applied to the load sensor shown in FIGS. 1B and 1C and the inductance and conductance of a coil.

That is, the inductance of coil 5 changes according to load F1 applied to load-receiving portion 40. FIG. 2B indicates a relationship between inductance L51 of coil 5 and load F1 applied to load sensor 2, that is, core 4. In FIG. 2B, the horizontal axis represents the amount of load F1, and the vertical axis represents inductance L51. In FIG. 2B, the value of inductance L51 is indicated by a ratio (%) of the value of inductance L51 to the value of the inductance obtained when the value of load F1 is zero.

Upon change in inductance L51 of coil 5, the resonance frequency of resonance circuit 50 including coil 5 changes. As described above, in detection circuit 3, oscillating circuit 30 outputs the oscillation signal having a frequency corresponding to the resonance frequency, and period-measuring circuit 31 outputs a signal corresponding to the period of the oscillation signal. Here, the period of the oscillation signal is proportional to a square root of a product of inductance L51 of inductor L5 and the capacitance of capacitor C5. Period-measuring circuit 31 outputs a signal corresponding to the period. Since squaring circuit 32 outputs signal S32 obtained by calculating a square value of signal S31 output from period-measuring circuit 31, signal S32 output from squaring circuit 32 changes linearly in response to a change in inductance L51 of coil 5. Although temperature-compensation circuit 33 corrects fluctuations in signal S32 output from squaring circuit 32 due to temperature, signal S33 output from temperature-compensation circuit 33 also changes linearly in response to change in inductance L51 of coil 5.

Signal processing circuit 34 calculates inductance L51 of coil 5 based on signal S33 output from temperature-compensation circuit 33, and then calculates the amount of load F1 applied to load-receiving portion 40 based on a change in calculated inductance L51 of coil 5. In other words, detection circuit 3 detects load F1 applied to load-receiving portion 40 of core 4, based on the change in inductance L51 of coil 5.

The conventional magnetostrictive load sensor disclosed in Japanese Patent Laid-Open Publication No. 2004-226196 requires a ferromagnetic case preventing the magnetic flux generated by a current flowing through the coil from leaking outside, as to reduce the effect of outside magnetic fields. Thus, the magnetostrictive load sensor requires a space for the ferromagnetic case, and has difficulties in reducing the thickness.

Since the conventional load sensor disclosed in Japanese Utility Model Laid-Open Publication No. 6-74942 detects the load by deformation of the strain gauge together with strain generators, it requires the strain generators by processing a plate. Since the conventional load sensor requires the plate having a thickness allowing the strain generators to be designed, it also has difficulties in reducing the thickness.

In load sensor 2 according to Embodiment 1, magnetic path M1 that is a closed magnetic path through which the magnetic flux passes when a current flows in coil 5 is formed along circumferential direction D400 of hollow part 400. Thus, in load sensor 2, the magnetic flux hardly leaks outside from core 4, and the ferromagnetic case as in the conventional sensors is not required. Load sensor 2 according to Embodiment 2 does not require the space for the ferromagnetic case, thus being thin.

Figure 29:
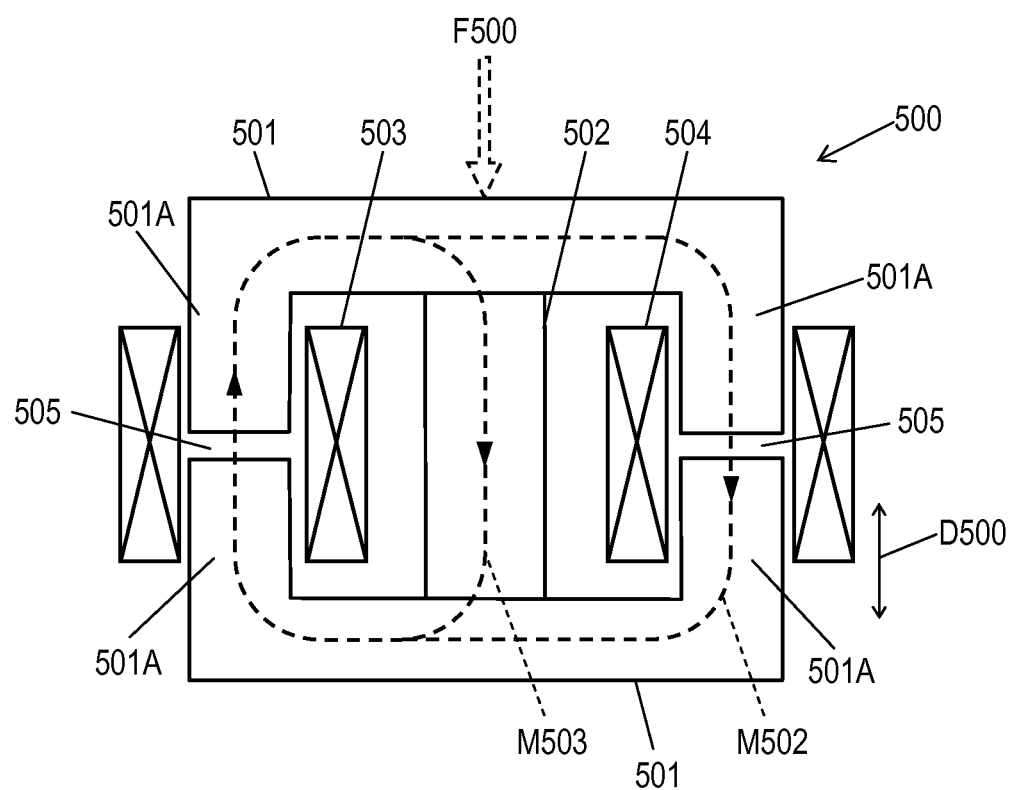
FIG. 29 is a schematic view of a conventional load sensor.

In conventional load sensor 500 shown in FIG. 29 disclosed in Japanese Patent Laid-Open Publication No. 2003-194639, magnetic paths M502 and M503 that pass through cores 501 and magnetostriction component 502 are closed magnetic paths. However, in load sensor 500, the surface on which magnetic paths M502 and M503 are formed is parallel to the direction in which magnetostriction component 502 receives load F500. Thus, in order to reserve a magnetic path length necessary for forming magnetic paths M502 and M503, it is necessary to reserve a certain length in the direction of load F500 to be applied to cores 501. Thus, load sensor 500 has difficulties in structurally reducing the thickness in the direction of receiving load F500.

In contrast, in load sensor 2 according to Embodiment 1, plane P40 having magnetic path M1 formed thereon crosses direction D40 (a vertical direction in FIG. 1C) in which load-receiving portion 40 of core 4 receives load F1. Thus, the dimension of core 4 in circumferential direction D400 has only to be adjusted to provide the magnetic path length of magnetic path M1. Thus, the size of core 4 in crossing direction D40 that is a thickness direction does not depend on the magnetic path length of magnetic path M1. Therefore, load sensor 2 can be thinner in a direction of receiving a load than conventional load sensor 500.

Figure 3:
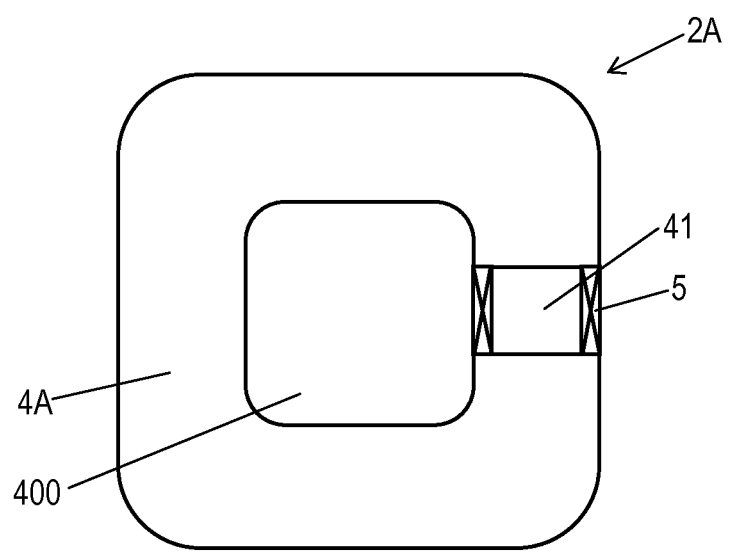
FIG. 3 is a schematic plan view of another load sensor according to Embodiment 1.

In load sensor 2 according to Embodiment 1, the shape of core 4 is not limited to the annular-shape, and may have other loop shape surrounding hollow part 400. FIG. 3 is a schematic plan view of another load sensor 2A according to Embodiment 1. In FIG. 3, components identical to those of load sensor 2 shown in FIG. 1B are dented by the same reference numerals. Load sensor 2A shown in FIG. 3 includes core 4A to which coil 5 is attached, instead of core 4 of load sensor 2 shown in FIG. 1B. Core 4A shown in FIG. 3 has a rectangular loop shape with four round corners. The core of the load sensor according to Embodiment 1 may have another polygonal loop shape. The core according to Embodiment 1 form a closed magnetic path, along circumferential direction D400 of hollow part 400, through which the magnetic flux passes when a current flows through coil 5.

Furthermore, in detection circuit 3 of load detector 1 according to Embodiment 1, signal processing circuit 34 may detect change in load F1 based on signal S31 output from period-measuring circuit 31, while detection circuit 3 does not include squaring circuit 32 and temperature-compensation circuit 33. Furthermore, the configuration of detection circuit 3 in FIG. 2A is an example. Detection circuit 3 may have another configuration as long as it detects load F1 based on change in inductance L51 of coil 5.

FIG. 2B also indicates a relationship between conductance G51 of coil 5 and load F1 applied to load sensor 2, that is, core 4. Since conductance G51 of coil 5 changes according to a change in load F1, detection circuit 3 may detect load F1 based on a change in conductance G51 of coil 5. In FIG. 2B, the value of conductance G51 is indicated by a ratio (%) of the value of conductance G51 to the value of conductance G51 obtained when the value of load F1 is zero. Here, in the method of detecting the load, in load sensor 2 according to Embodiment 1, a current is supplied to coil 5, and load F1 applied to load-receiving portion 40 in predetermined direction D40 may be detected based on change in conductance G51 of coil 5.

Figure 4A:
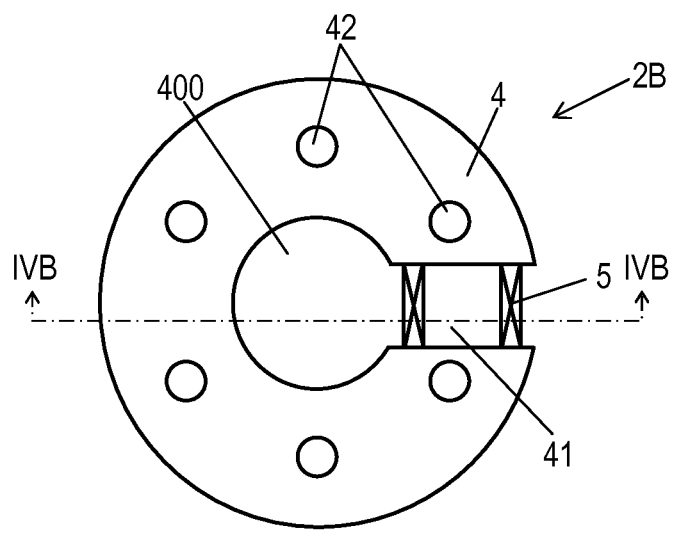
FIG. 4A is a schematic plan view of still another load sensor according to Embodiment 1.
Figure 4B:
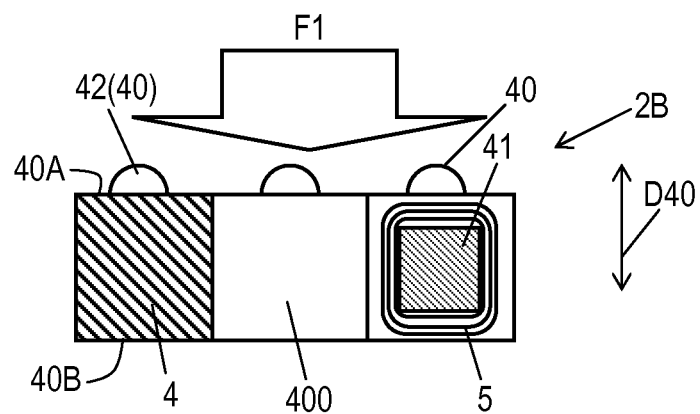
FIG. 4B is a schematic cross-sectional view of the load sensor at line IVB-IVB shown in FIG. 4A.

Although in load sensor 2 according to Embodiment 1, load-receiving portion 40 is a flat surface disposed in a thickness direction of core 4 (crossing direction D40). Load-receiving portion 40 is not necessarily a flat surface. FIG. 4A is a schematic plan view of still another load sensor 2B according to Embodiment 1. FIG. 4B is a schematic cross-sectional view of load sensor 2B at line IVB-IVB shown in FIG. 4A. In FIGS. 4A and 4B, components identical to those of load sensor 2 shown in FIGS. 1B and 1C are denoted by the same reference numerals. In load sensor 2B shown in FIGS. 4A and 4B, includes at least one protrusion 42 at surface 40A that protrudes in crossing direction D40. Protrusion 42 has a hemispherical shape, and protrudes in a direction opposite to load F1. Protrusion 42 is not limited to be hemispherical, and may have another shape. Protrusion 42 may be made of, for example, elastic material.

Figure 5:
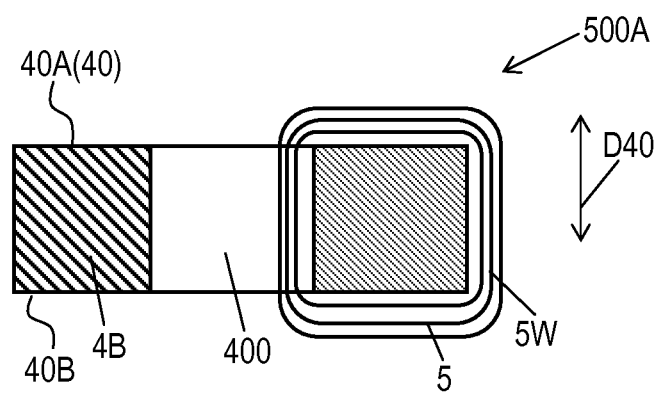
FIG. 5 is a schematic cross-sectional view of a comparative example of a load sensor.

FIG. 5 is a cross-sectional view schematically illustrating load sensor 500A of a comparative example. In FIG. 5, components identical to those of load sensor 2 shown in FIGS. 1B and 1C are denoted by the same reference numerals. Load sensor 500A in FIG. 5 includes core 4B instead of core 4 of load sensor 2 shown in FIGS. 1B and 1C. Core 4B shown in FIG. 4 has an annular shape surrounding hollow part 400. Coil 5 obtained by merely winding lead wire 5W around core 4B having the annular shape causes a part of coil 5 to protrude from load-receiving portion 40 in a thickness direction of core 4B (crossing direction D40). This configuration allows a load applied to load-receiving portion 40 to be added to coil 5, and may destroy coil 5. In this configuration, load-receiving portion 40 has a part at which coil 5 partially protrudes, and another part. Thus, the load may be applied unevenly to load-receiving portion 40, and load sensor 500A of the comparative example may not detect the load precisely.

Load sensor 2 according to Embodiment 1 may include structure for avoiding load F1 applied to coil 5. The structure in load sensor 2 shown in FIGS. 1B and 1C according to Embodiment 1 is structure in which attachment part 41 of core 4 has a size in a thickness direction of core 4 (crossing direction D40) is smaller than a size of another part of core 4 in crossing direction D40 (see FIGS. 1B and 1C). Attachment part 41 is configured, as shown in FIG. 1C, such that, in the thickness direction of core (crossing direction D40), size T2 of coil 5 is smaller than size T1 of core 1. That is, size T1 of core 4 in crossing direction D40 is determined such that coil 5 is fit within a size of another part of core 4 in crossing direction D40. This configuration allows coil 5 not to protrude from load-receiving portion 40 in the thickness direction of core 4 (crossing direction D40). Thus, in load sensor 2, it is possible to avoid application of load F1 to coil 5 and prevent coil 5 from being broken. Furthermore, since load F1 is applied evenly to load-receiving portion 40, load sensor 2 can detect load F1 accurately.

Figure 6:
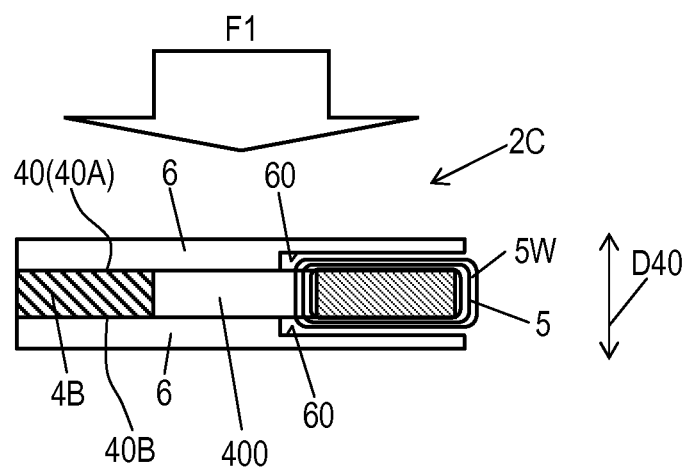
FIG. 6 is a schematic cross-sectional view of a further load sensor according to Embodiment 1.

FIG. 6 is a schematic cross-sectional view of further load sensor 2C according to Embodiment 1. In FIG. 6, components identical to those of load sensor 500A of the comparative example shown in FIG. 5 are denoted by the same reference numerals. Load sensor 2C includes coil 5 including lead wire 5W wound around core 4B. Coil 5 has a portion protruding from load-receiving portion 40 (surface 40A). Load sensor 2C according to Embodiment 1 further includes two protecting parts 6 instead of attachment part 41 of load sensor 2 shown in FIGS. 1B and 1C. Protecting parts 6 are made of, for example, resin material, have plate shapes, and are placed to both sides of core 4B in the thickness direction of core 4 (crossing direction D40). Protecting parts 6 cover the portion protruding from load-receiving portion 40 of coil 5. That is, protecting parts 6 cover at least coil 5 on load-receiving portion 40.

In this configuration, load F1 is applied to load-receiving portion 40 (surface 40A) via protecting part 6. Thus, it prevents load F1 from being applied directly to coil 5 and prevents coil 5 from being broken. Protecting parts 6 have recesses 60 avoiding coil 5, and recesses 60 face coil 5. Since protecting parts 6 do not contact coil directly coil 5, and hence, can securely avoid load F1 applied to coil 5.

Figure 7A:
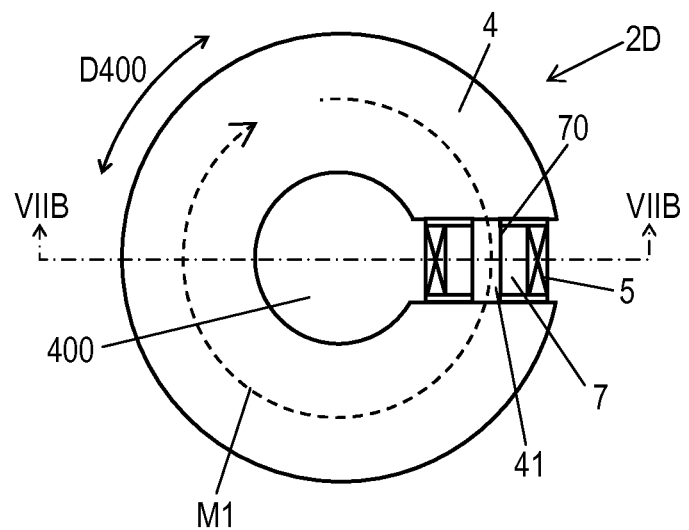
FIG. 7A is a schematic plan view of a further load sensor according to Embodiment 1.
Figure 7B:
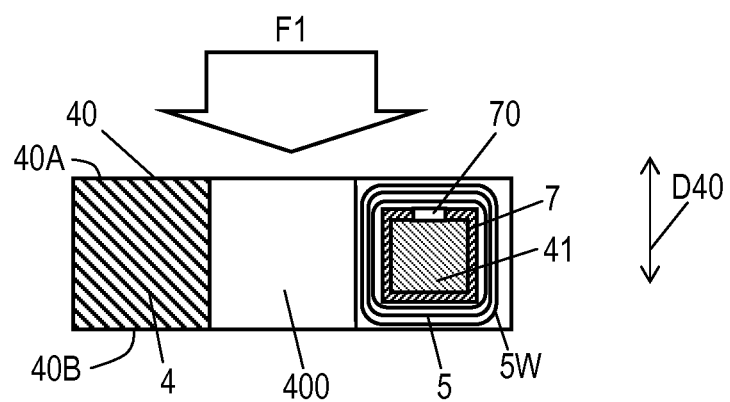
FIG. 7B is a schematic cross-sectional view of the load sensor at line VIIB-VIIB shown in FIG. 7A.

FIG. 7A is a schematic plan view of further load sensor 2D according to Embodiment 1. FIG. 7B is a schematic cross-sectional view of load sensor 2D at line VIIB-VIIB shown in FIG. 7A. In FIGS. 7A and 7B, components identical to those of load sensor 2 shown in FIGS. 1B and 1C are denoted by the same reference numerals. Load sensor 2D further includes bobbin 7 attached to attachment part 41 that is a part of core 4. Coil 5 includes lead wire 5W wound around core 4 via bobbin 7. Bobbin 7 is made of insulating material, such as resin material. As illustrated in FIG. 7B, bobbin 7 has a cross section with a C-shape having opening 70 extending in circumferential direction D400 (at the upper part of FIG. 7A). Bobbin 7 has opening 70 extending in circumferential direction D400. Bobbin 7 is inserted into core 4 through opening 70 for the attachment. Then, lead wire 5W is wound around bobbin 7 attached to core 4 to constitute coil 5.

Since coil 5 is formed by winding lead wire 5W around core 4 via bobbin 7 in this configuration, bobbin 7 can prevent short-circuiting between core 4 and coil 5. Thus, core 4 can be made of material having high conductivity, for example, such as iron, chromium, or nickel. Core 4 can be made of an alloy, such as manganese (Mn)-zinc (Zn) ferrite and permalloy. In the case that core 4 is made of an alloy, the strength of core 4 can be increased. Thus, load sensor 2D can be thinner while the strength thereof can be maintained.

Figure 8A:
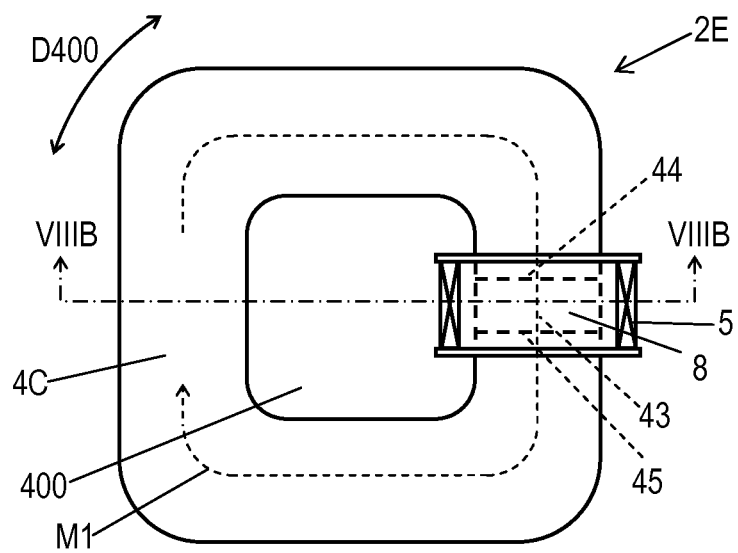
FIG. 8A is a schematic plan view of a further load sensor according to Embodiment 1.
Figure 8B:
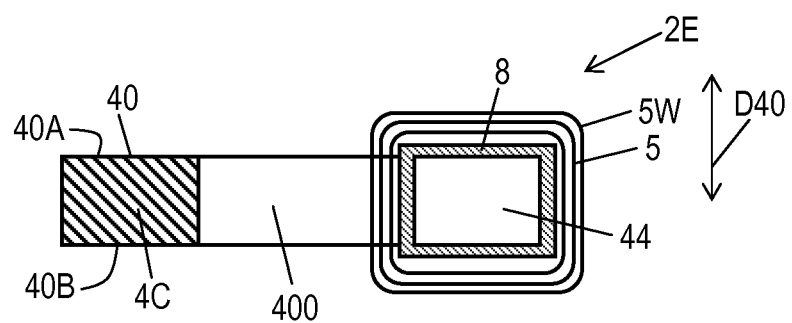
FIG. 8B is a schematic cross-sectional view of the load sensor at line VIIIB-VIIIB shown in FIG. 8A.

FIG. 8A is a schematic plan view of further load sensor 2E according to Embodiment 1. FIG. 8B is a schematic cross-sectional view of load sensor 2E at line VIIIB-VIIIB shown in FIG. 8A. In FIGS. 8A and 8B, components identical to those of load sensor 2D shown in FIGS. 7A and 7B are denoted by the same reference numerals. Load sensor 2E includes core 4C and bobbin 8, instead of core 4 and bobbin 7. Core 4C has gap 43 in a part of hollow part 400 in circumferential direction D400. Bobbin 8 is made of the same material as bobbin 7 of load sensor 2D shown in FIGS. 7A and 7B, and is attached to core 4C to cover gap 43. As illustrated in FIG. 8A, core 4C has a C-shape formed by cutting a part (gap 43) of core 4 in a plan view. Gap 43 is provided one end 44 of core 4 and another end 45 of core 4. Ends 44 and 45 of core 4 faces gap 43 in circumferential direction D400 face each other across gap 43. Bobbin 8 is made of insulating material (e.g., resin material). As illustrated in FIGS. 8A and 8B, bobbin 8 has a tubular shape. Bobbin 8 does not has an opening as opening 70 in bobbin 7 shown in FIGS. 7A and 7B. Bobbin 8 is attached to core 4C through gap 43 so that edges 44 and 45 fit into a hollow of the tubular shape of bobbin 8.

Figure 8C:
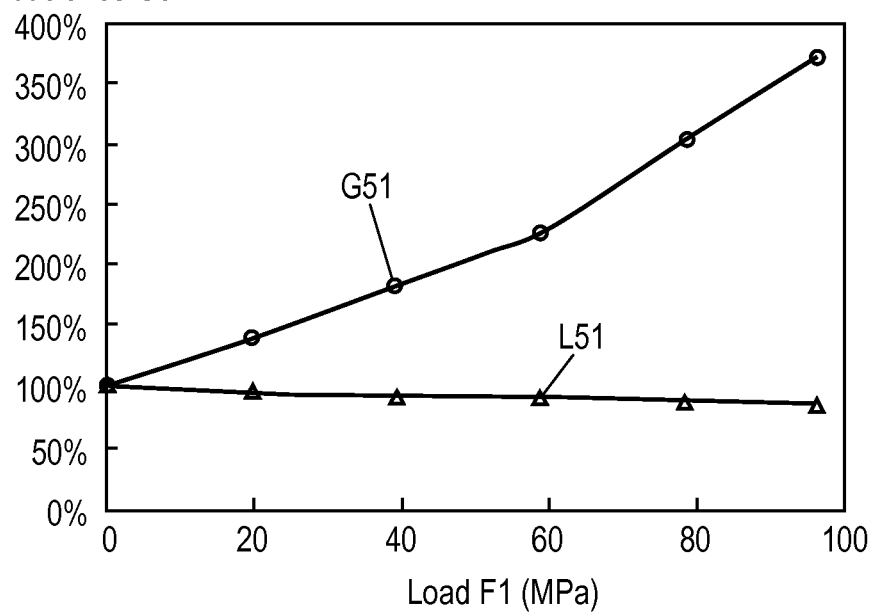
FIG. 8C indicates a relationship between a load applied to the load sensor in FIGS. 8A and 8B and the inductance and conductance of a coil.

In this configuration, bobbin 8 having lead wire 5W previously wound around the bobbin constituting coil 5 can be attached to core 4C through gap 43. Thus, a process of winding lead wire 5W around core 4 is not necessary, and coil 5 can be easily attached to core 4. Furthermore, gap 43 is located at a certain point in magnetic path M1 of load sensor 2E. Specifically, since air with a low magnetic permeability is located at the point in magnetic path M1, variations in inductance L51 of coil 5 can be reduced. FIG. 8C indicates a relationship between load F1 applied to load sensor 2E, that is, core 4C, and inductance L51 and conductance G51 of coil 5. In FIG. 8C, the horizontal axis represents an amount of load F1, and the vertical axis represents inductance L51 and conductance G51. In FIG. 8C, each of the values of inductance L51 and conductance G51 is indicated by a ratio (%) of each of the value of inductance L51 and conductance G51 to respective one of the values of inductance L51 or conductance G51 when the value of load F1 is zero.

Figure 9A:
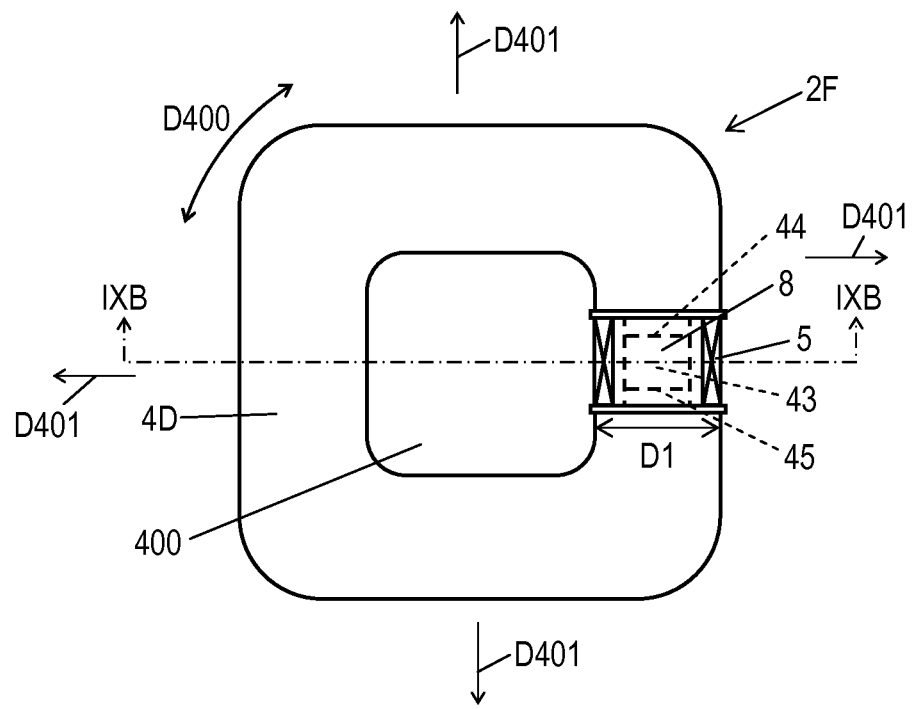
FIG. 9A is a schematic plan view of a further load sensor according to Embodiment 1.
Figure 9B:
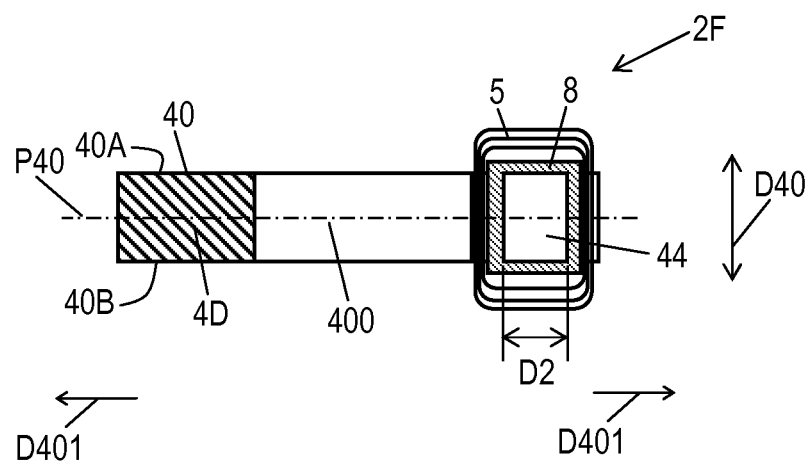
FIG. 9B is a schematic cross-sectional view of the load sensor at line IXB-IXB shown in FIG. 9A.

FIG. 9A is a schematic plan view of further load sensor 2F according to Embodiment 1. FIG. 9B is a schematic cross-sectional view of load sensor 2F at line IXB-IXB shown in FIG. 9A. In FIGS. 9A and 9B, components identical to those of load sensor 2E shown in FIGS. 8A and 8B are denoted by the same reference numerals. Load sensor 2F includes core 4D instead of core 4C in FIGS. 8A and 8B. Core 4D has ends 44 and 45 facing each other across gap 43, and has a C-shape in a top view similarly to core 4C of load sensor 2E shown in FIGS. 8A and 8B. As illustrated in FIGS. 9A and 9B, bobbin 8 fits into width D1. That is, bobbin 8 fits into width D1 in direction D401 perpendicular to circumferential direction D400 and parallel to surface P40. Width D2 of ends 44 and 45 is smaller than width D1 in direction D401 so that width D2 of edges 44 and 45 of core 4D fit into the hollow the tubular shape of bobbin 8.

Figure 10A:
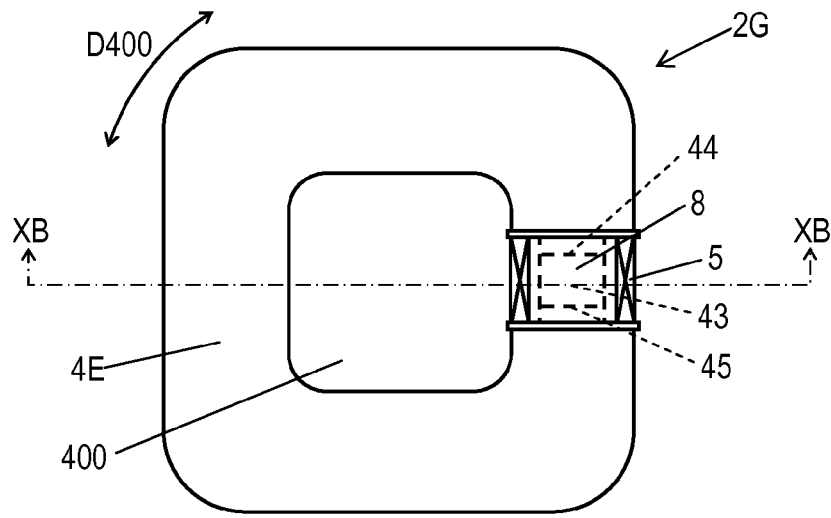
FIG. 10A is a schematic plan view of a further load sensor according to Embodiment 1.
Figure 10B:
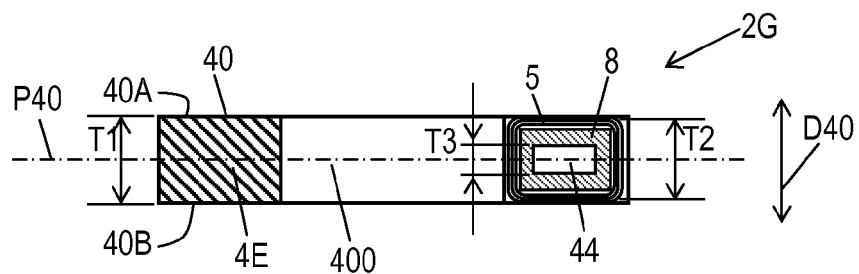
FIG. 10B is a schematic cross-sectional view of the load sensor at line XB-XB shown in FIG. 10A.

FIG. 10A is schematic view of further load sensor 2G according to Embodiment 1. FIG. 10B is a schematic cross-sectional view of load sensor 2G at line XB-XB shown in FIG. 10A. In FIGS. 10A and 10B, components identical to those of load sensor 2F shown in FIGS. 9A and 9B are denoted by the same reference numerals. Load sensor 2G includes core 4E instead of core 4D shown in FIGS. 9A and 9B. As illustrated in FIGS. 10A and 10B, width T2 of coil 5 around bobbin 8 is smaller than width T1 of core 4E in the thickness direction of core 4 (crossing direction D40) so that coil 5 does not protrude from load-receiving portion 40. Core 4E has ends 44 and 45 facing each other across gap 43, and has a C-shape in top view. As illustrated in FIG. 10B, width T3 of each of ends 44 and 45 of core 4E is smaller than width T2 thereof in crossing direction D40 so that ends 44 and 45 fit into the hollow of the tubular shape of bobbin 8.

Figure 11:
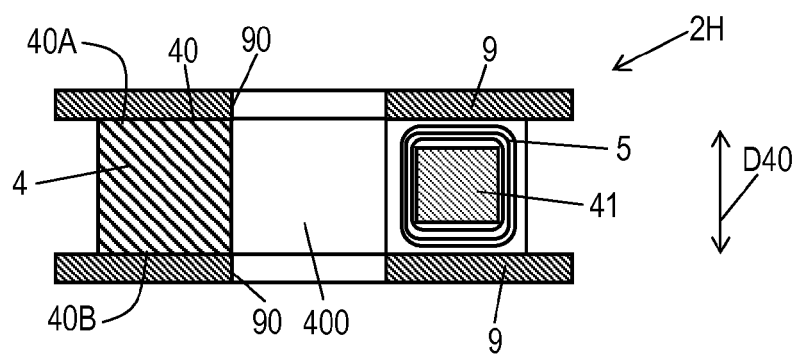
FIG. 11 is a schematic cross-sectional view of a further load sensor according to Embodiment 1.

FIG. 11 is a schematic plan view of further load sensor 2H according to Embodiment 1. In FIG. 11, components identical to those of load sensor 2 shown in FIGS. 1B and 1C are denoted by the same reference numerals. Load sensor 2H further includes two shields 9. Shields 9 are made of metal, have a plate shape, and are placed to both sides of core 4 in the thickness direction of core (crossing direction D40). Shields 9 can reduce the effect of magnetic fields outside load sensor 2. Each of shields 9 according to Embodiment 1 has hole 90 therein through which an object, such as a bolt, for applying load F1 to load sensor 2H is connected to hollow part 400 of core 4. Hole 90 may not necessarily be provided. That is, it is not necessary for shields 9 to have hole 90 therein in the case that the object is not connected to hollow part 400 of core 4. Coil 5 is desirably spaced apart from shields 9 by a predetermined gap to prevent short-circuiting between core 4 and coil 5 through shields 9.

Figure 12A:
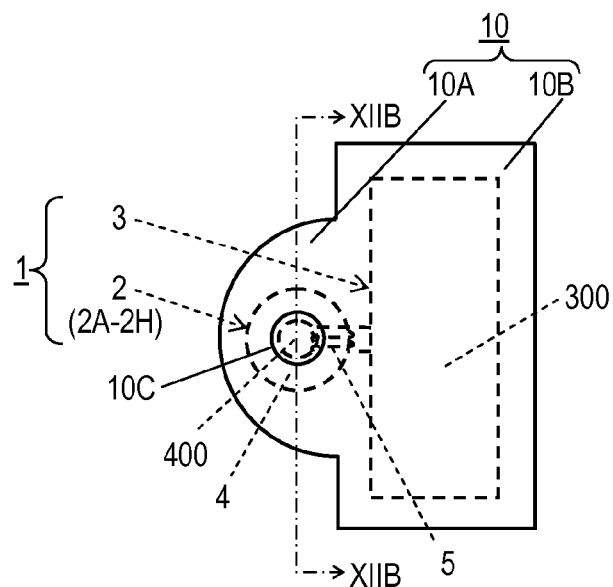
FIG. 12A is a schematic view of a load detector according to Embodiment 1.
Figure 12B:
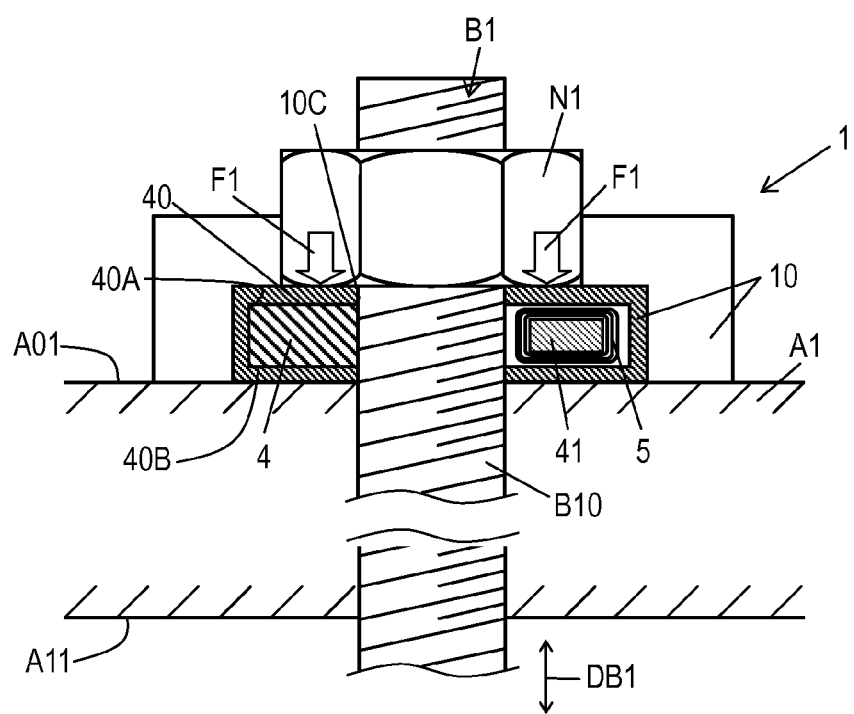
FIG. 12B schematically illustrates a usage of the load detector according to Embodiment 1.

FIG. 12A is a schematic view of load detector 1 according to Embodiment 1. FIG. 12B is a schematic cross-sectional view of load detector 1 at line XIIB-XIIB shown in FIG. 12A for illustrating the usage of load detector 1 according to Embodiment 1. Since load sensor 2 (2A to 2H) according to Embodiment 1 can be thinner than the conventional magnetostrictive load sensors and conventional load sensor 500, load sensor 2 (2A to 2H) can be used as, for example, a washer. Thus, load detector 1 including load sensor 2 (2A to 2H) according to Embodiment 1 can be used for, for example, detecting the tightening axial load in tightening a bolt to a building part. A method for detecting the tightening axial load of bolt B1 using load detector 1 will be described below with referring to FIGS. 12A and 12B. The tightening axial load is a load, when bolt B1 is tightened with nut N1, to be applied to structural object A1, such as building parts including a wall and a ceiling, in axial direction DB1 in which bolt B1 extends.

Load detector 1 includes load sensor 2 (2A to 2H) and detection circuit 3 shown in FIG. 1A, board 300 on which detection circuit 3 is mounted, and case 10 for accommodating load sensor 2 (2A to 2H) and board 300. Case 10 is made of non-magnetic material, such as a resin material, and includes first case 10A that has a half disc shape and protects load sensor 2 (2A to 2H), and second case 10B that has a flat rectangular parallelepiped shape and protects board 300. Case 10 made of non-magnetic material does not contribute to formation of magnetic path M1 unlike the ferromagnetic case for reducing the effect of outside magnetic fields. Thus, as long as case 10 has strength enough to endure load F1, it can be thinner.

First case 10A has aperture 10C therein through which shank B10 of bolt B1 passes. Aperture 10C has a circular shape in a plan view. Shank B10 of bolt B1 passes through aperture 10C and hollow part 400 of core 4.

A method of using load detector 1 according to Embodiment 1 will be described below. First, bolt B1 is passed from back surface A11 to surface A01 of structural object A1. Next, shank B10 that protrudes from surface A01 of structural object A1 is passed through aperture 10C and hollow part 400 of core 4. Then, nut N1 is tightened through shank B10 with structural object A1 to sandwich first case 10A. Accordingly, load F1 that is the tightening axial load of bolt B1 is applied to load-receiving portion 40 of core 4 via first case 10A. Thus, load detector 1 can detect the tightening axial load of bolt B1, using detection circuit 3 that detects load F1 applied to load-receiving portion 40.

As described above, load sensor 2 (2A to 2H) according to Embodiment 1 can be used as a washer. Thus, when, for example, load sensor 2 (2A to 2H) is attached to an anchor bolt for suspending a ceiling of a tunnel as a washer, the tightening axial load of the anchor bolt can be monitored at an off-site location.

Exemplary Embodiment 2

Figure 13A:
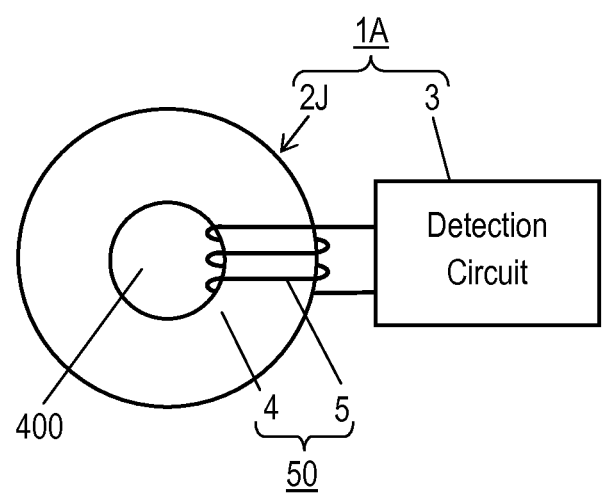
FIG. 13A is a schematic view of a load detector according to Exemplary Embodiment 2.

FIG. 13A a schematic view of load detector 1A according to Exemplary Embodiment 2. In FIG. 13A, components identical to those of load detector 1 shown in FIG. 1A according to Embodiment 1 are denoted by the same reference numerals. Load detector 1A includes load sensor 2J instead of load sensor 2 of load detector 1 shown in FIG. 1A according to Embodiment 1.

Figure 13B:
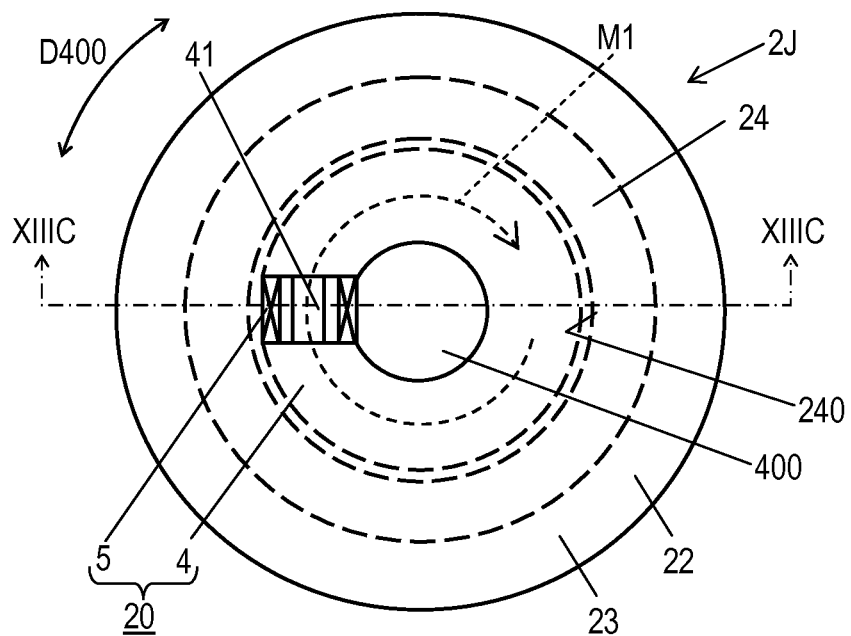
FIG. 13B is a schematic plan view of a load sensor according to Embodiment 2.
Figure 13C:
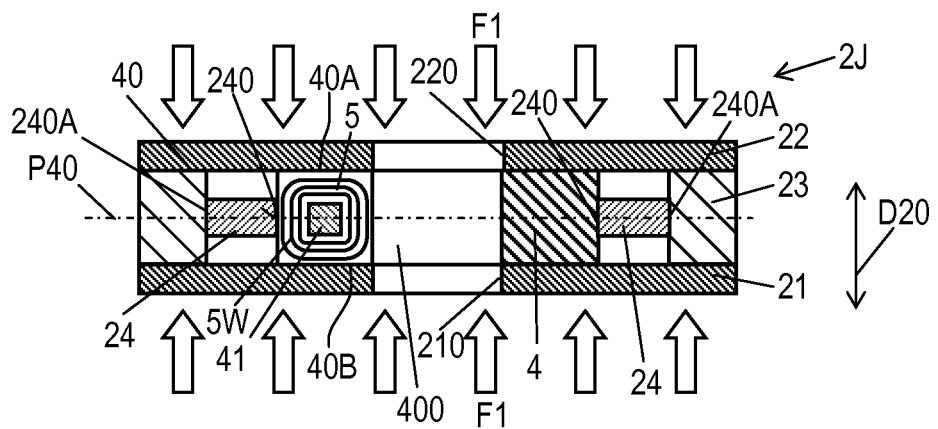
FIG. 13C is a schematic cross-sectional view of the load sensor at line XIIIC-XIIIC shown in FIG. 13B.

FIG. 13B is a plan view of load sensor 2J. FIG. 13C is a cross-sectional view of load sensor 2J at line XIIIC-XIIIC shown in FIG. 13B. In FIGS. 13B and 13C, components identical to those of load sensor 2 shown in FIGS. 1B and 1C according to Embodiment 1 are denoted by the same reference numerals. Load sensor 2J according to Embodiment 2 includes detection unit 20, first plate 21, second plate 22, elastic body 23, and board 24. Detection unit 20 includes core 4 made of magnetic material and coil 5 magnetically coupled to core 4. First plate 21 and second plate 22 are disposed to sandwich detecting unit 20 from both sides in predetermined detecting direction D20. Elastic body 23 is made of material having lower elasticity than that of core 4, and positions first plate 21 and second plate 22. Detecting unit 20 receives load F1 applied in detecting direction D20 from first plate 21 and second plate 22. Load detector 1A includes load sensor 2J and detection circuit 3, as shown in FIG. 13A. Detection circuit 3 detects load F1 based on a change of a magnetic property (inductance or conductance) of coil 5.

Load detector 2J and load detector 1A according to Embodiment 2 will be detailed below. The structure to be described below is a mere example of the present disclosure that is not limited by the following embodiments. As long as the other embodiments are from the technical ideas of the present disclosure, various modifications to the embodiments are possible according to each design. Although a thickness direction of core 4 (detecting direction D20) is a vertical direction, a direction from core 4 to plate 21 is downward, and a direction from core 4 to plate 22 is upward in the following description, these directions are relative, and do not limit the usage of load sensor 2J and load detector 1.

Load detector 1A includes load sensor 2J and detection circuit 3, as shown in FIG. 13A. Load sensor 2J according to Embodiment 2 includes detection unit 20, first plate 21, second unit 22, elastic body 23, and board (structural component) 24, as shown in FIGS. 13A to 13C. FIG. 13B illustrates none of second plate 22 and elastic body 23.

Detecting unit 20 includes core 4 made of magnetic material and coil 5 coupled magnetically to core 4. Core 4 is made of magnetic material, such as Ni(nickel)-Zn(zinc) ferrite, and has an annular shape. Core 4 is made of magnetic material exhibiting an inverse magnetostriction effect with load F1 applied to core 4. The inverse magnetostriction effect is an effect by which magnetized core 4 is mechanically strained with the applied load and the magnetic permeability of core 4 is changed with the strain.

Coil 5 is formed by winding lead wire 5W on core 4 such that lead wire 5W repetitively passes alternately through hollow part 400 and outside 401. Lead wire 5W is preferably made of a copper wire, such as an enameled wire, covered with an insulating material wire. In the description below, a part of core 4 having lead wire 5W wound thereon (having coil 5 attached thereto) is attachment part 41.

Attachment part 41 is configured, as shown in FIG. 13C, such that, coil 5 is fit within a size of another part of core 5 in a vertical direction of core 5. This configuration allows coil 5 not to protrude from an upper surface (or a lower surface) of core 4. Thus, it is possible to avoid application of load F1 to coil 5 and prevent coil 5 from being broken. Attachment part 41 may arbitrarily be designed to have the above sizes.

As illustrated in FIG. 13B, the magnetic flux passes inside core 4 when a current flows in coil 5. This forms magnetic path M1 (magnetic circuit) along circumferential direction D400 of hollow part 400. Magnetic path M1 is a closed magnetic path. Therefore, load sensor 2J prevents the magnetic flux from leaking outside of core 4, and hence, does not require a case made of ferromagnetic material to prevent the magnetic flux from leaking.

First plate 21 and second plate 22 are made of, for example, metal and have plate shapes. As illustrated in FIG. 13B, first plate has a circular shape in a plan view from detecting direction D20. Second plate has a circular shape in a plan view. Core 4 has surfaces 40 and 40A opposite to each other in detecting direction D20. As illustrated in FIG. 13C, first plate 21 contacts surface 40A of core 4, and is disposed under core 4. Furthermore, as illustrated in FIG. 13C, second plate 22 contacts surface 40 of core 4, and is disposed above core 4. That is, first plate 21 and second plate 22 are disposed to sandwich core 4 in a vertical direction (detecting direction D20).

In the case that load sensor 2J of load detector 1A employs the load sensors according to Embodiment 1, detecting direction D20 is identical to crossing direction D40.

The shapes of first plate 21 and second plate 22 are not limited to a circular shape in a plan view, but may be, for example, rectangular shapes or annular shapes. First plate 21 and second plate 22 have strength enough to endure load F1 having an assumed maximum value. First plate 21 and second plate 22 may not necessarily be made of metal, but may be made of, for example, resin material, such as carbon-fiber-reinforced plastic (CFRP).

Elastic body 23 is made of, for example, an adhesive mainly containing, for example, an epoxy resin or a silicone resin. Elastic body 23 couples first plate 21 and second plate 22 to each other by adhering to an outer circumferential edge of an upper surface of first plate 21 and an outer circumferential edge of an lower surface of second plate 22. Elastic body 23 is not necessarily made of an adhesive, but of only material having lower elasticity than core 4.

As illustrated in FIG. 13C, board 24 is accommodated in a space surrounded by first plate 21, second plate 22, and elastic body 23. Board 24 is fixed by causing outer circumferential edge 240A of board 24 to contact elastic body 23. As illustrated in FIG. 13B, board 24 has an annular shape in a plan view having positioning hole 240 provided at a center thereof. Positioning hole 240 has a diameter slightly larger than core 4. Core 4 is positioned in a predetermined position with core 4 fit into positioning hole 240. In other words, board (structural component) 24 is a structural component placed between first plate 21 and second plate 22 to position detecting unit 20 at a predetermined position. Board (structural component) 24 has positioning hole 240 passing through the board in a vertical direction (detecting direction D20). Core 4 is disposed inside positioning hole 240. The shape of positioning hole 240 may not necessarily be the circular shape in a plan view, but may be a rectangular shape in the plan view. The shape of positioning hole 240 may be have another shape having core 4 to fit into positioning hole 240.

In load sensor 2J according to Embodiment 2, detection circuit 3 is implemented by board 24 having electronic components mounted thereon. In other words, a circuit (detection circuit 3) is formed on board (structural component) 24. That is, in load detector 1A, detection circuit 3 is formed unitarily with load sensor 2J. Detection circuit 3 is not necessarily formed on board 24, but may be separate from board 24. Detection circuit 3 may be formed on, for example, a board outside load sensor 2J. That is, in load detector 1A, detection circuit 3 may be provided separately from load sensor 2J An operation of load detector 2J and load detector 1A according to Embodiment 2 will be described below. First, a current is supplied to coil 5 from an external power supply outside load sensor 2J to magnetize core 4 and form magnetic path M1. Oscillation circuit 30 of detection circuit 3 supplies the current to coil 5.

Next, load F1 applied upward to the lower surface of first plate 21 (an upward arrow shown in FIG. 13C) causes elastic body 23 to warp to push up first plate 21, and load F1 is applied to core 4 through first plate 21. The load applied to core 4 changes the magnetic permeability of core 4 by an inverse magnetostriction effect according to the amount of load F1, accordingly, changing inductance L51 of coil 5. Similarly, load applied F1 downward to an upper surface of second plate 22 causes elastic body 23 to warp to push down plate 22, and load F1 is applied to core 4 through second plate 22, accordingly changing inductance L51 of coil 5 according to the amount of load F1. In other words, in load sensor 2J according to Embodiment 2, core 4 of detecting unit 20 (detection unit 20) receives load F1 applied in a vertical direction (detecting direction D20) from first plate 21 and second plate 22.

Similarly to load detector 1 according to Embodiment 1, inductance L51 of coil 5 changes, and detection circuit 3 detects load F1 applied to core 4, based on the change.

As described above, in load sensor 2J according to Embodiment 2, detecting unit 20 is sandwiched between first plate 21 and second plate 22, and elastic body 23 positions plates 21 and 22. Thus, load sensor 2J according to Embodiment 2 does not require to process first plate 21 and second plate 22 to include the conventional strain generators disclosed in Japanese Utility Model Laid-Open Publication No. 6-74942. Therefore, the size of first plate 21 and second plate 22 in the thickness direction (predetermined direction D20) can be smaller, and load sensor 2J can be thinner. Furthermore, since load sensor 2J includes elastic body 23, load F1 applied to first plate 21 and second plate 22 is properly transmitted to core 4, hence increasing the detection accuracy of load F1 of load sensor 2J.

Figure 14A:
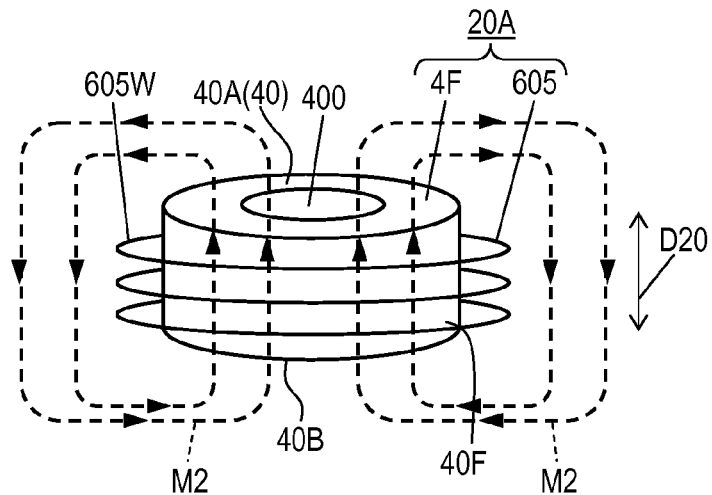
FIG. 14A is a schematic view of another detecting unit of the load sensor according to Embodiment 2.

FIG. 14A is a schematic view of detecting unit 20A of load sensor 2J according to Embodiment 2. In FIG. 14A, components identical to those of detecting unit 20 shown in FIGS. 13A, 13B, and 13C are denoted by the same reference numerals. Detecting unit 20A includes core 4F and coil 605 including lead wire 605W wound around core 4F, instead of core 4 and coil 5 shown in FIGS. 13A, 13B, and 13C. Core 4F does not include attachment part 41 shown in FIGS. 13B and 13C, and has surfaces 40 and 40A opposite to each other having annular shapes. In detecting unit 20 shown in FIGS. 13A, 13B, and 13C, coil 5 is configured such that magnetic path M1 is a closed magnetic path when a current flows through coil 5. In detecting unit 20A shown in FIG. 14A, lead wire 605W is wound along outer circumferential surface 40F of core 4F. A magnetic flux generated by a current that flows in coil 605 forms magnetic path M2 that is an open magnetic path and passes through not only the inner side of core 4F but also the outside surface thereof. Since magnetic path M2 is formed on a surface parallel to predetermined direction D40, predetermined direction D40 does not cross this surface. Since core 4F does not have to be processed for providing attachment part 41 with this structure, core 4F is easily fabricated. Furthermore, coil 605 can be easily fabricated by simply winding lead wire 605W around core 4F. Since core 4F and coil 605 can be easily designed in detecting unit 20A, load sensor 2J can be easily miniaturized and thinner.

Figure 14B:
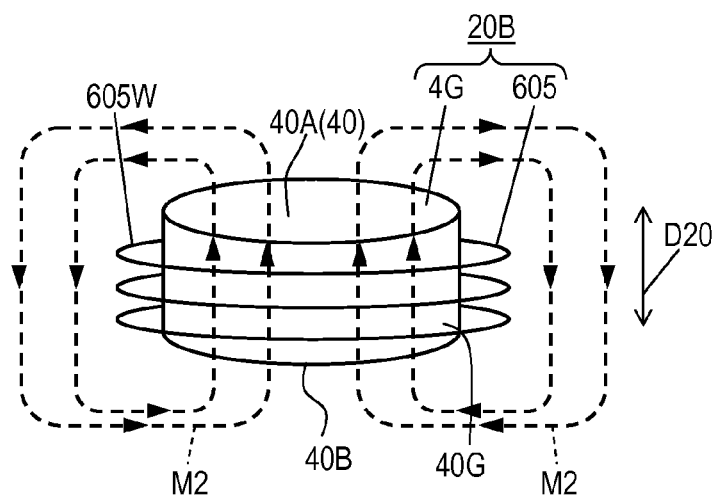
FIG. 14B is a schematic view of still another detecting unit of the load sensor according to Embodiment 2.

FIG. 14B is a schematic view of still another detecting unit 20B of load sensor 2J according to Embodiment 2. In FIG. 14B, components identical to those of detecting unit 20A shown in FIG. 14A are denoted by the same reference numerals. Detecting unit 20B includes core 4G instead of core 4F of detecting unit 20A shown in FIG. 14A. Core 4G does not have hollow part 400 therein, and has a cylindrical shape with surfaces 40 and 40A opposite to each other, and outer circumferential surface 40G. Lead wire 605W of coil 605 is wound around outer circumferential surface 40G of core 4F. Detecting unit 20B can form magnetic path M2 that is an open magnetic path.

Figure 15:
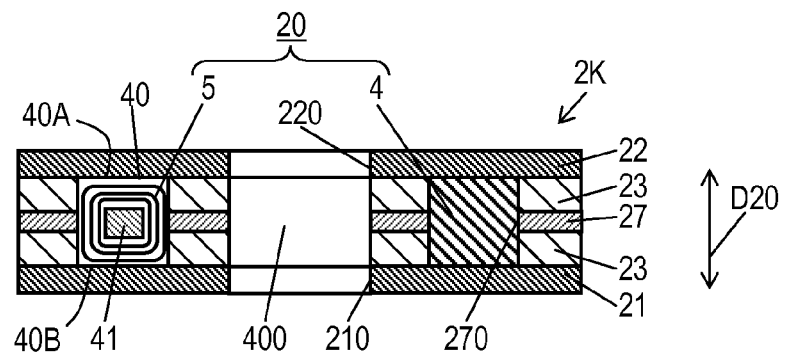
FIG. 15 is a schematic cross-sectional view of another load sensor according to Embodiment 2.

FIG. 15 is a cross-sectional view of further load sensor 2K according to Embodiment 1. In FIG. 15, components identical to those of load sensor 2J shown in FIGS. 13B and 13C are denoted by the same reference numerals. Load sensor 2K shown in FIG. 15 includes structural component 27 for positioning core 4, instead of board 24 of load sensor 2J shown in FIGS. 13B and 13C.

Structural component 27 is made of, for example, a metal or a resin material, having a sheet shape, and is accommodated in a space surrounded by first plate 21, second plate 22, and elastic body 23. Structural component 27 is fixed with elastic body 23 filling a part of the space. Structural component 27 has an annular shape in a plan view, similarly to board 24, and has positioning hole 270 provided therein at a center thereof. Positioning hole 270 has a circular shape in a plan view. Core 4 is positioned at a predetermined position while core 4 fits into positioning hole 270. The shape of positioning hole 270 in a plan view is not necessarily the circular shape, but may be, for example, a rectangular shape as long as core 4 fits into positioning hole 270.

Load sensor 2K does not include board 24. Detection circuit 3 is formed outside of load sensor 2K. Since structural component 27 does not include any circuit, such as detection circuit 3, the size of structural component 27 in the thickness direction (detecting direction D20) can be smaller than the width of board 24, and load sensor 2K can be thinner.

Load sensors 2J and 2K according to Embodiment 1 may not include board 24 or structural component 27 as long as core 4 is positioned by first plate 21, second plate 22, and elastic body 23. Board 27 and structural component 27 allow load sensors 2J and 2K not to require a structure for positioning core 4, by processing plates 21 and 22. Thus, the sizes of first plate 21 and second plate 22 in the thickness direction (detecting direction D20) can be smaller.

Exemplary Embodiment 3

Figure 16A:
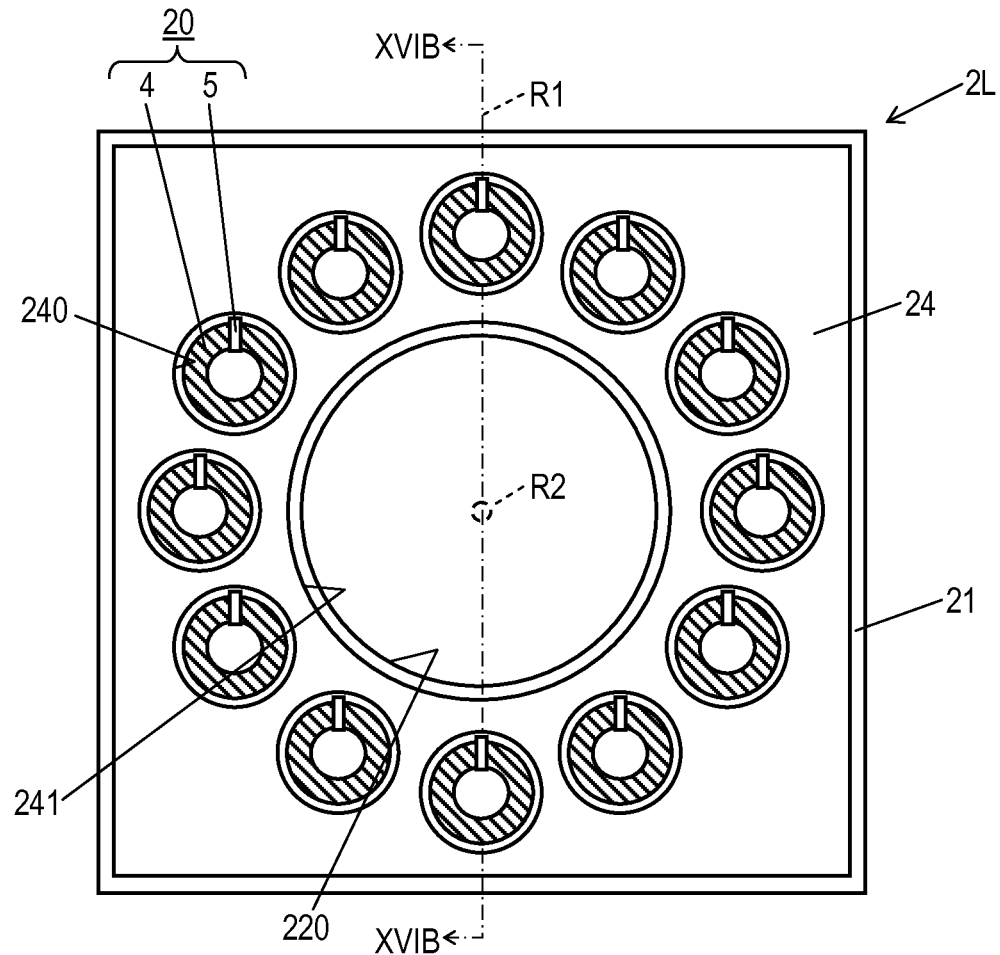
FIG. 16A is a schematic plan view of a load sensor according to Exemplary Embodiment 3.
Figure 16B:
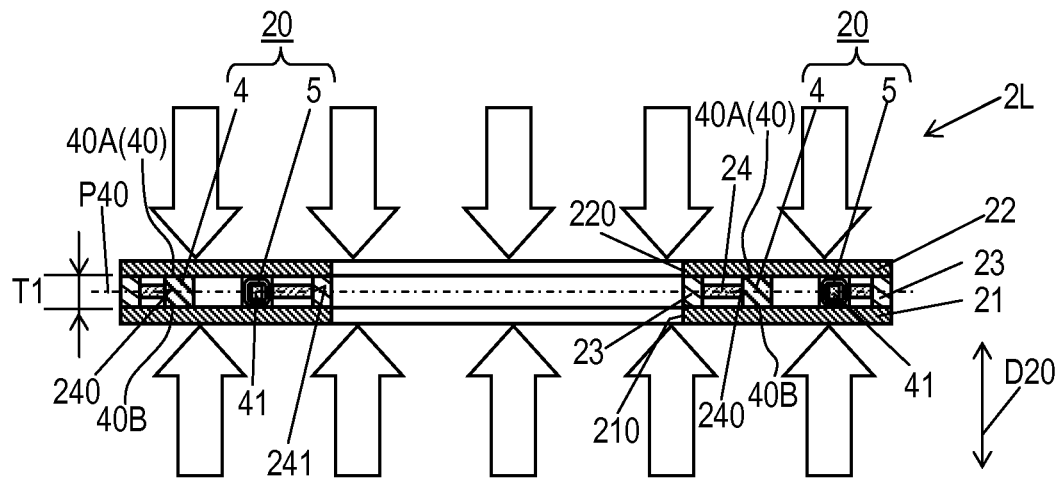
FIG. 16B is a schematic cross-sectional view of the load sensor at line XVIB-XVIB shown in FIG. 16A.

FIG. 16A is a plan view of load sensor 2L according to Exemplary Embodiment 3. FIG. 16B is a cross-sectional view of load sensor 2L at line XVIB-XVIB shown in FIG. 16A. In FIGS. 16A and 16B, components identical to those of load sensor 2J shown in FIGS. 13B and 13C are denoted by the same reference numerals. Load sensor 2L according to Embodiment 3 is used in, for example, a ground anchor construction method.

The ground anchor construction method will be briefly described below. When an artificial slope is formed by, for example, excavation or embankment of the ground, the ground anchor construction method is generally used to stabilize a structural object provided on the slope. Load sensors and load detectors are used to detect and monitor a tensile load of an anchor used in the ground anchor construction method.

When load sensors 2 and 2A to 2H according to Embodiment 2 are used in a large device, such as an anchor, core 4 having a large diameter needs to be used according to the size of the device. However, it is difficult to increase the diameter of core 4 without increasing the width of core 4 in the thickness direction (detecting direction D20). In load sensors 2 and 2A to 2H, increasing of the size of core 4 in the thickness direction (detecting direction D20) is unavoidable. Here, load sensor 2L according to Embodiment 3 includes detecting units 20 for detecting a load of the large device.

Load sensor 2 according to Embodiment 3 includes plural (twelve according to Embodiment 3) detection units 20, first plate 21, second plate 22, elastic body 23, and board 24 (structural component), as shown in FIGS. 16A and 16B. Detecting units 20 are arranged along plane P40 perpendicular to a vertical direction (detecting direction D20). FIG. 16A does not illustrate second plate 22 and elastic body 23. Here, the term "perpendicular" means not only completely "perpendicular" but also almost "perpendicular".

First plate 21 has a square shape in a plan view. Second plate 22 has a square shape in a plan view. First plate 21 is disposed under cores 4 while contacting lower surfaces 40B of cores 4. Second plate 22 is disposed above cores 4 while contacting upper surfaces 40A of cores 4. First plate 21 and second plate 22 are disposed to sandwich cores 4 from both sides in a vertical direction (detecting direction D20).

First plate 21 has aperture 210 passing through a center thereof in the vertical direction (detecting direction D20), as shown in FIGS. 16A and 16B. Second plate 22 has aperture 220 passing through a center thereof in the vertical direction (detecting direction D20), as shown in FIG. 16B. Apertures 210 and 220 have circular shapes in a plan view. The shapes of apertures 210 and 220 in a plan view are not necessarily the circular shapes, but may be shapes allowing a shank of a bolt or a tendon to be pass through.

In load sensor 2L according to Embodiment 3, apertures 210 and 220 are provided in the centers of first plate 21 and second plate 22, respectively, but may be provided in other positions of first plate 21 and second plate 22. Aperture 210 may be provided at a position other than the center of first plate 21 as long as aperture 210 passes through first plate 21. Aperture 220 may be provided at a position other than the center of second plate 22 as long as aperture 220 passes through second plate 22.

Elastic body 23 couples first plate 21 and second plate 22 by adhering to an outer circumferential edge of the upper surface of first plate 21 and an outer circumferential edge of the lower surface of second plate 22, as illustrated in FIG. 16B. Furthermore, elastic body 23 couples first plate 21 to second plate 22 by adhering to an circumferential edge of aperture 210 on the upper surface of first plate 21 and an circumferential edge of aperture 220 on the lower surface of second plate 22, as illustrated in FIG. 16B. Elastic body 23 thus positions first plate 21 and second plate 22.

As illustrated in FIG. 16B, board 24 is accommodated in a space surrounded by first plate 21, second plate 22, and elastic body 23. Board 24 has a square shape viewing from detecting direction D20 as illustrated in FIG. 16A. Board 24 has aperture 241 provided therein at a center thereof. Aperture has a circular shape having a slightly larger diameter (for example, 140 mm) than apertures 210 and 220 viewing from detecting direction D20. The shape of aperture 241 viewing from detecting direction D20 is a shape allowing a shank of a bolt or a tendon to be passed through, similarly to apertures 210 and 220. Board 24 is fixed while the outer circumferential edge of board 24 and the inner circumferential edge of aperture 241 contact elastic body 23.

Figure 17A:
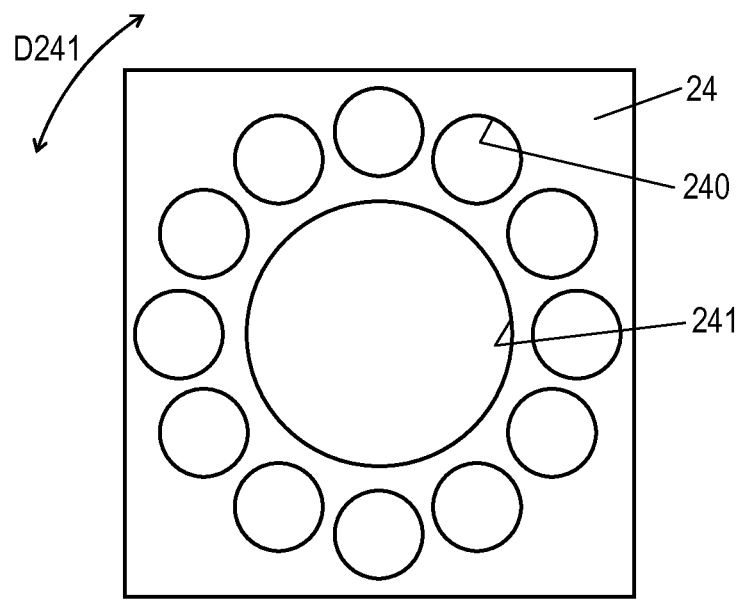
FIG. 17A is a plan view of a structural component of the load sensor according to Embodiment 3.

FIG. 17A is a plan view of board 24. Board 24 has (twelve according to Embodiment 3) positioning holes 240 arranged around aperture 241, as illustrated in FIG. 16A. Positioning holes 240 have circular shapes in a plan view, and arranged around aperture 241 along circumferential direction D241 of aperture 241 at equal intervals.

Figure 17B:
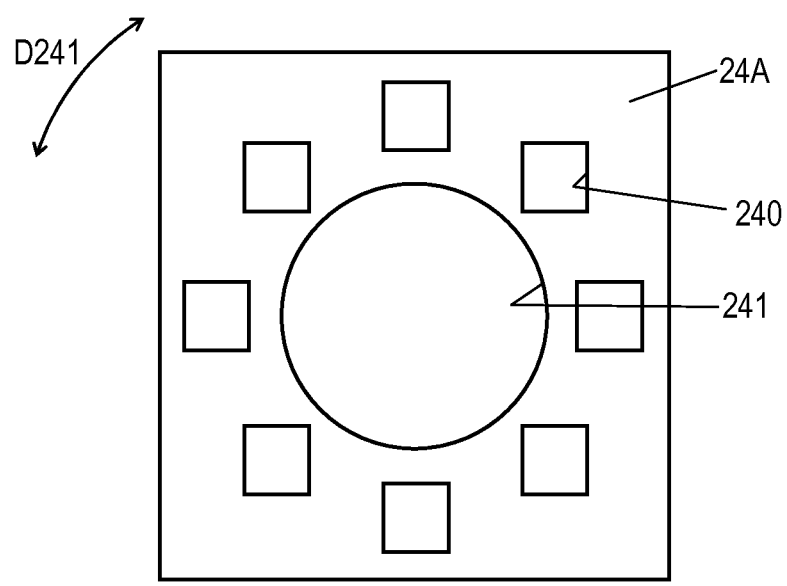
FIG. 17B is a plan view of another structural components of the load sensor according to Embodiment 3.

FIG. 17B is a plan view of another board 24A according to Embodiment 3. In FIG. 17B, components identical to those of board 24 shown in FIGS. 16A to 17A are denoted by the same reference numerals. In board 24A shown in FIG. 17B, positioning holes 240 have rectangular shapes viewing from detecting direction D20. In other words, as long as positioning holes 240 have shape allowing core 4 to fit, positioning holes 240 may have other shapes, such as circular shapes or rectangular shapes.

As illustrated in FIG. 16A, in load sensor 2L according to Embodiment 3, positioning holes 240 are arranged symmetrically top each other with respect to reference line R1 that passes through the center of aperture 241 and on plane P40 perpendicular to the vertical direction (detecting direction D20). Positioning holes 240 are arranged symmetrically to each other with respect to reference point R2 that is the center of aperture 241 on plane P40. Thus, core 4 is disposed in each of positioning holes 240 allows detecting units 20 to be arranged symmetrically to each other with respect to reference line R1 and reference point R2. Detecting units 20 are thus arranged around apertures 210 and 220.

Figure 18A:
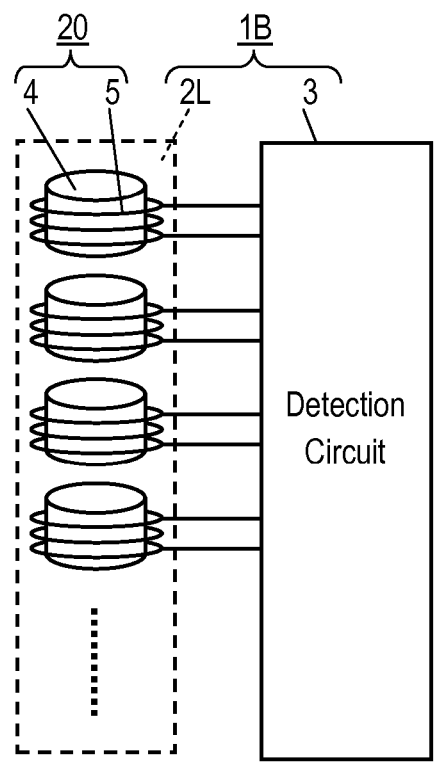
FIG. 18A is a schematic view of a load detector according to Embodiment 3.

FIG. 18A is a schematic view of another load detector 1B according to Embodiment 3. In FIG. 18A, components identical to those of load detector 1A shown in FIG. 13A are denoted by the same reference numerals. As illustrated in FIG. 18A, detecting units 20 are separately connected electrically to detection circuit 3 of load detector 1B. In other words, both ends of coils 5 are separately connected electrically to detection circuit 3. Detection circuit 3 can detect a load applied to all of cores 4 of detecting units 20, that is, the load applied to load sensor 2L, based on a sum of levels of output signals of detecting units 20.

Detection circuit 3 may calculate a load applied to each of detecting units 20, based on a level of an output signal of detecting unit 20. In this configuration, detection circuit 3 can detect the distribution of load F1 applied to first plate 21 or second plate 22, by comparing the loads applied to detecting units 20. In other words, this configuration allows load detector 1B to determine whether or not the load is evenly applied to first plate 21 or second plate 22.

Figure 18B:
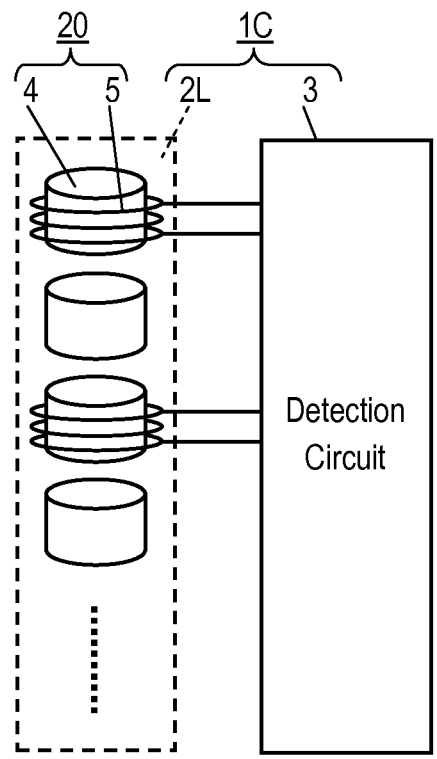
FIG. 18B is a schematic view of another load detector according to Embodiment 3.

FIG. 18B is a schematic view of still another load detector 1C according to Embodiment 3. In FIG. 18B, components identical to those of load detector 1B shown in FIG. 18A are denoted by the same reference numerals. As illustrated in FIG. 18B, in load detector 1C, detection circuit 3 can detect a load even when at least one detecting unit 20 does not include coil 5. Thus, load detector 1C can reduce the number of detecting units 20 according to the detection target, thus reducing the fabrication cost.

Figure 19:
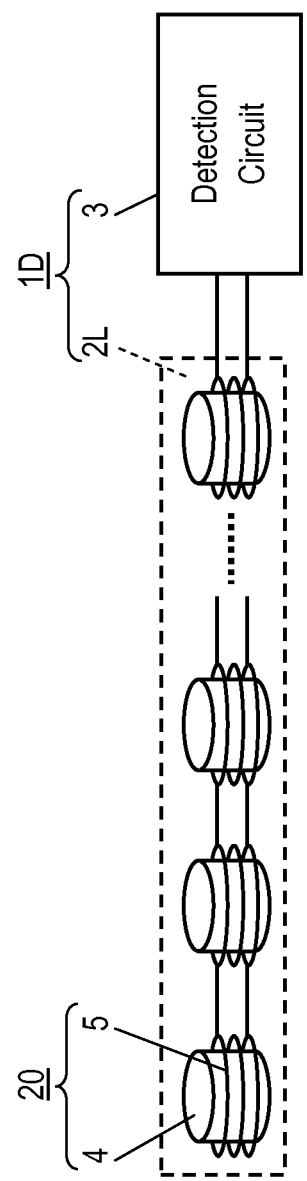
FIG. 19 is a schematic view of still another load detector according to Embodiment 3.

FIG. 19 is a schematic view of further load detector 1D according to Embodiment 3. In FIG. 19, components identical to those of load detector 1B shown in FIG. 18A are denoted by the same reference numerals. In load detector 1D, coils 5 of detecting units 20 are electrically connected in series with detection circuit 3. Both ends of the series circuit including coils 5 connected in series are electrically connected to detection circuit 3. In this configuration, even when the level of the output signal of one detecting unit 20 is small, detection circuit 3 calculates the load based on the sum of levels of output signals of all detecting units 20, accordingly increases the detection accuracy of the load. This configuration can hardly cause mutual interference between coils 5 adjacent to each other.

Figure 20:
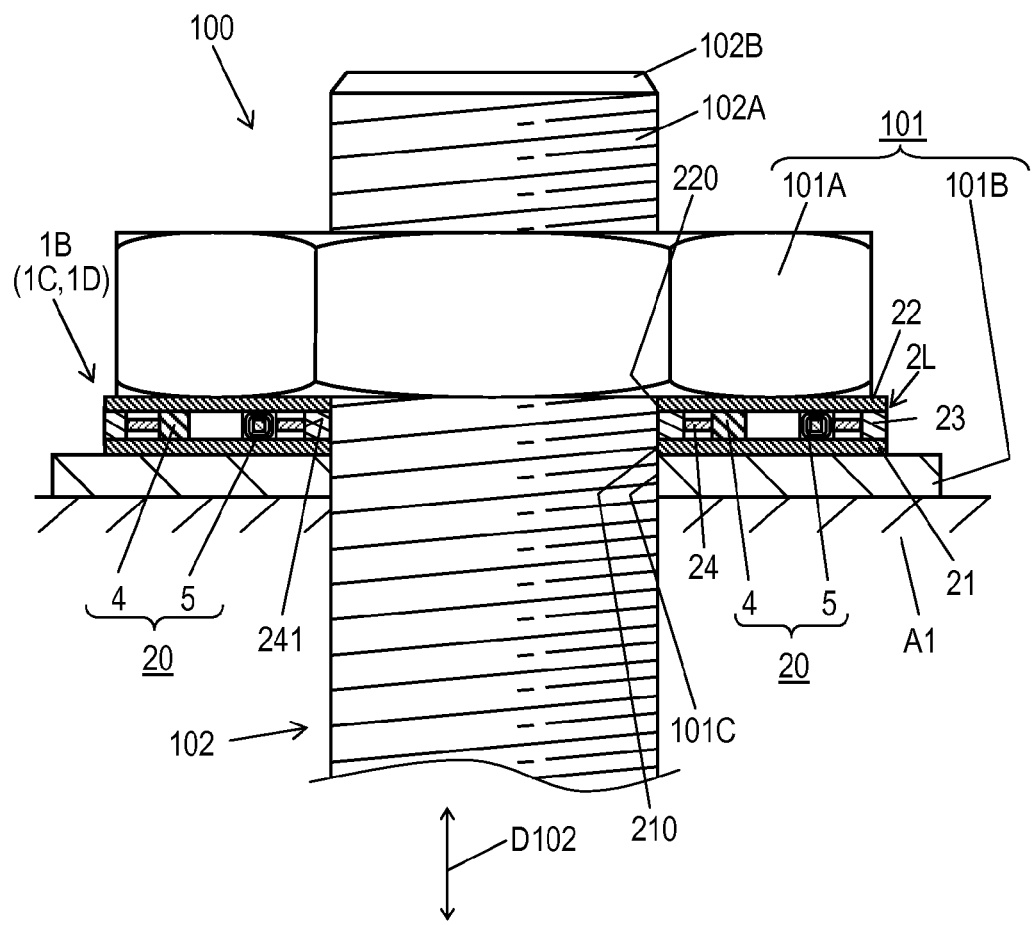
FIG. 20 schematically illustrates a usage of the load sensor according to Embodiment 3.

FIG. 20 is a schematic view of load sensor 2L and load detector 1B (1C, 1D) according to Embodiment 3 for illustrating a usage of the load sensor and the load detectors. Load sensor 2L and load detector 1B shown in FIG. 20 detect the tensile load of anchor 100 used in the ground anchor construction method. FIG. 20 does not illustrate detection circuit 3. Anchor 100 is used for transmitting the tensile load from structural object A1 to the ground. Anchor 100 includes an anchor body for transmitting the tensile load to the ground, anchor head 101 for coupling anchor 100 to structural object A1, and tension part 102 for transmitting the tensile load from anchor head 101 to the anchor body.

Anchor head 101 includes nut 101A that is an anchoring device, and anchor plate 101B that is a bearing plate and disposed on structural object A1. Anchor plate 101B has aperture 101C through which tendon 102A passes through. Tension part 102 includes tendon 102A. Tendon 102A having a bar shape is made of, for example, prestressed concrete (PC) strand steel wires, and extends in longitudinal direction D102. One end of tendon 102A in longitudinal direction D102 is mechanically connected to the anchor body. The other end of tendon 102A in longitudinal direction D102 is tightened with nut 101A while tendon 102A passes through aperture 101C of anchor plate 101B and apertures 210, 220, and 241 of load sensor 2L.

Load sensor 2L according to Embodiment 3 is sandwiched between nut 101A and anchor plate 101B. Load detector 1B can detect the tensile load of anchor 100 using detection circuit 3 by detecting a load of nut 101A for pushing down a surface of load sensor 2L.

As described above, load sensor 2L and load detector 1B (1C, 1D) according to Embodiment 3 detect a load using plural detecting units 20, and hence, allow the diameter of core 4 of each of detecting units 20 to be smaller than that of a load detector including only one detecting unit 20. As a result, the size of core 4 in the thickness direction can be also reduced. Thus, load sensor 2L and load detector 1B (1C, 1D) can be thinner even when they are used in a large device, such as anchor 100.

As illustrated in FIG. 16B, cores 4 of detecting units 20 have equal width T1 in the thickness direction in load sensor 2L according to Embodiment 3. Since surfaces of cores 4 perpendicular to the thickness direction (detecting direction D20) are flush, a load is evenly applied to cores 4, and prevents any unbalanced load. Here, the term "equal" means not only completely "equal" but also almost "equal". Thus, sizes T1 of cores 4 in the thickness direction may be slightly different within fabrication tolerances. It can be determined arbitrarily whether or not to equalize widths T1 of cores 4 in thickness direction.

As illustrated in FIG. 16A, detecting units 20 are arranged symmetrically to each other with respect to reference line R1 and reference point R2 in load sensor 2L according to Embodiment 3. Since cores 4 are arranged evenly on a plane perpendicular to the vertical direction (detecting direction D20) (for example, on a plane parallel to the lower surface of first plate 21 and the upper surface of second plate 22), a load is evenly applied to cores 4, and prevents any unbalanced load.

Figure 21A:
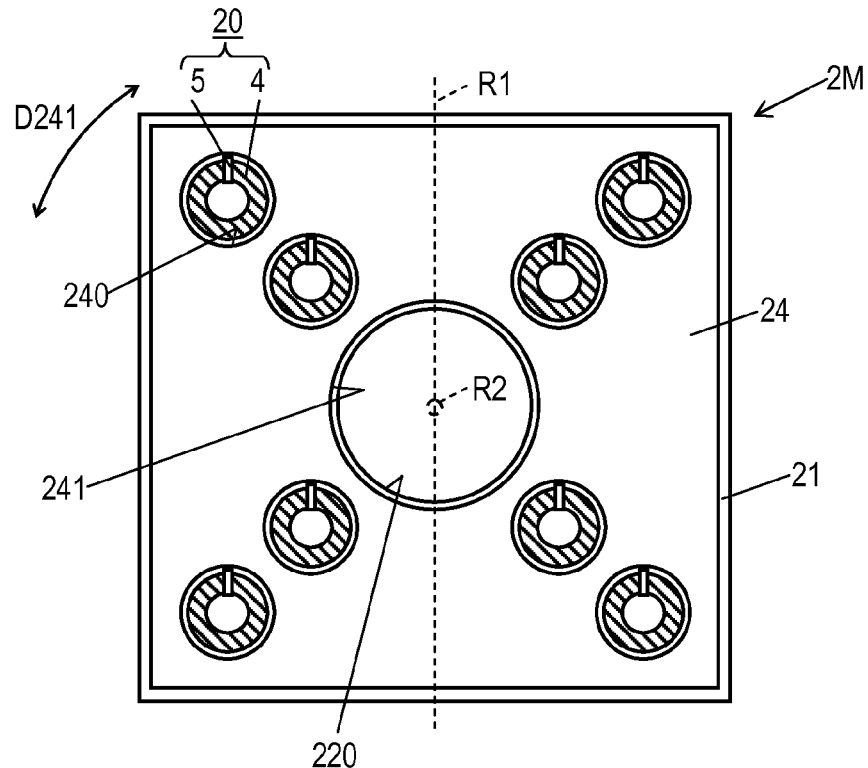
FIG. 21A is a schematic plan view of a further load sensor according to Embodiment 3.

FIG. 21A is a plan view of still another load sensor 2M according to Embodiment 3. In FIG. 21A, components identical to those of load sensor 2L shown in FIG. 16A are dented by the same reference numerals. In load sensor 2M, detecting units 20 are arranged along a diagonal line of board 24. In this configuration, detecting units 20 are arranged symmetrically to each other with respect to reference line R1 and reference point R2. Detecting units 20 may be arranged symmetrically not with respect to reference point R2 but with respect to reference line R1. Furthermore, detecting units 20 may be arranged symmetrically not with respect to reference line R1 but with respect to reference point R2.

Figure 21B:
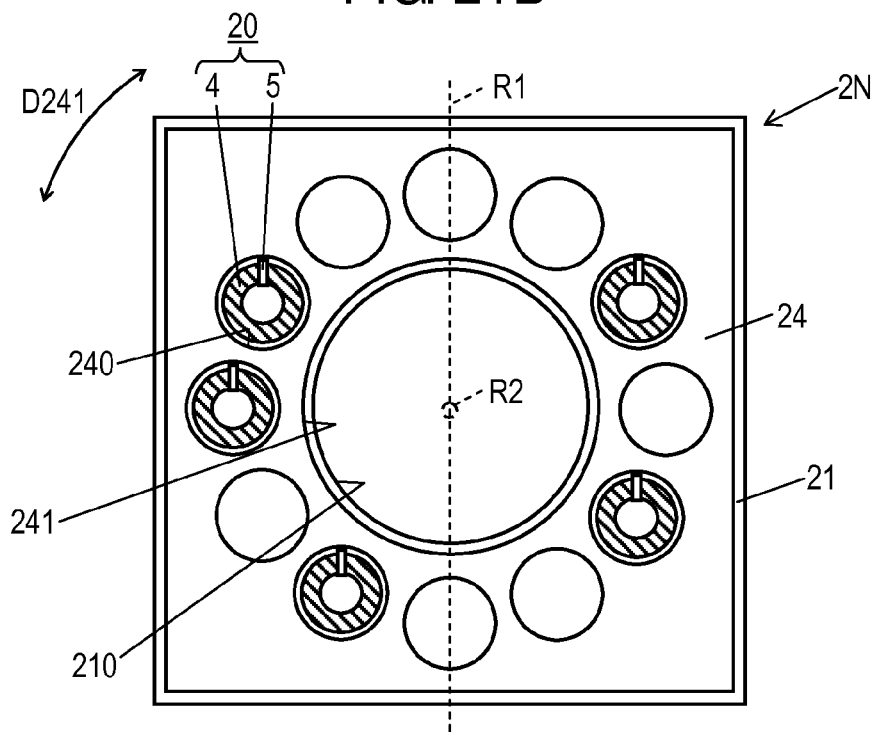
FIG. 21B is a schematic plan view of a further load sensor according to Embodiment 3.

FIG. 21B is a plan view of further load sensor 2N according to Embodiment 3. In FIG. 21B, components identical to those of load sensor 2L shown in FIG. 16A are denoted by the same reference numerals. In load sensor 2N, detecting units 20 are selectively disposed in some of positioning holes 240. Specifically, detecting units 20 are disposed on a one-to-one basis in two or more detection positions (positioning holes 240) selected out of detection positions. Furthermore, as illustrated in FIG. 21B, detecting units 20 are arranged asymmetrically to each other with respect to reference line R1 and reference point R2. FIGS. 21A and 21B do not illustrate plate 22 and elastic body 23.

Figure 22A:
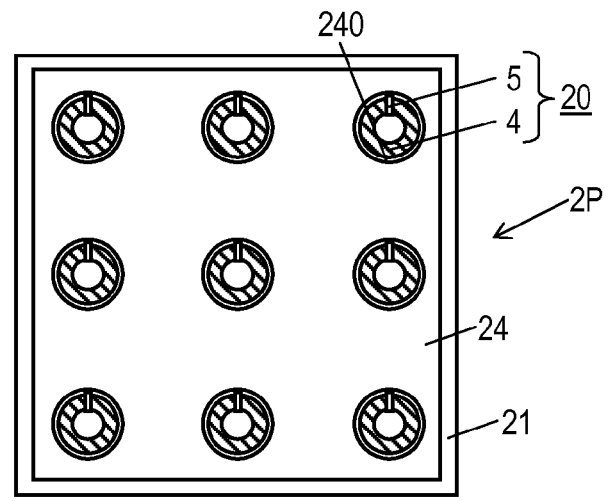
FIG. 22A is a schematic plan view of a further load sensor according to Embodiment 3.

In load sensor 2L (2M, 2N) according to Embodiment 3, first plate 21 has aperture 210, second plate 22 has aperture 220, and board 24 has aperture 241. It can be determined arbitrarily whether or not apertures 210, 220, and 241 are provided. FIG. 22A is a plan view of further load sensor 2P according to Embodiment 3. In FIG. 22A, components identical to those of load sensor 2L shown in FIG. 16A are denoted by the same reference numerals. In load sensor 2P, board 24 having a square shape in a plan view does not have aperture 241 therein. Board 24 has nine detecting units 20 therein. In load sensor 2P, first plate 21 and second plate 22 do not have apertures 210 and 220.

Figure 22B:
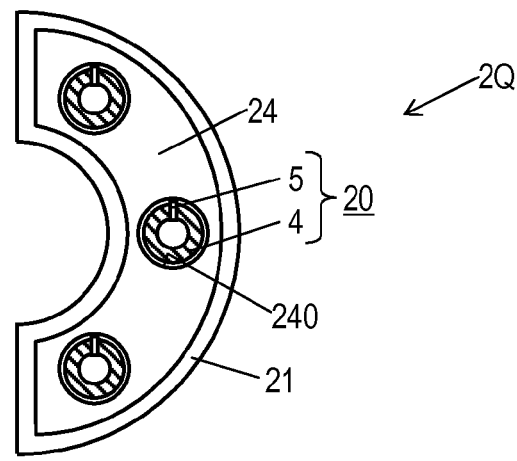
FIG. 22B is a schematic plan view of a further load sensor according to Embodiment 3.
Figure 22C:
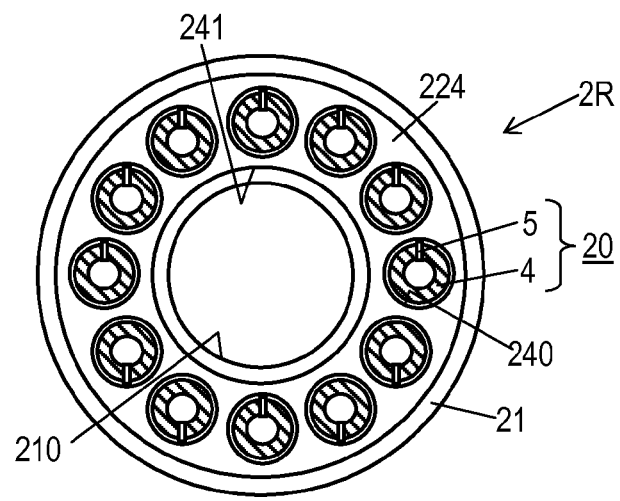
FIG. 22C is a schematic plan view of a further load sensor according to Embodiment 3.

In load sensor 2 according to Embodiment 3, first plate 21, second plate 22, and board 24 have square shapes, but may have other shapes. FIG. 22B is a plan view of further load sensor 2Q according to Embodiment 3. In FIG. 22B, components identical to those of load sensor 2L shown in FIG. 16A are denoted by the same reference numerals. First plate 21, second plate 22, and board 24 have semi-annular shapes in a plan view. FIG. 22C is a plan view of further load sensor 2R according to Embodiment 3. In FIG. 22C, components identical to those of load sensor 2L shown in FIG. 16A are denoted by the same reference numerals. In load sensor 2R, first plates 21, second plate 22, and board 24 have annular shapes in a plan view as shown in FIG. 22C. FIGS. 22A to 22C do not illustrate second plate 22 and elastic body 23.

Figure 23:
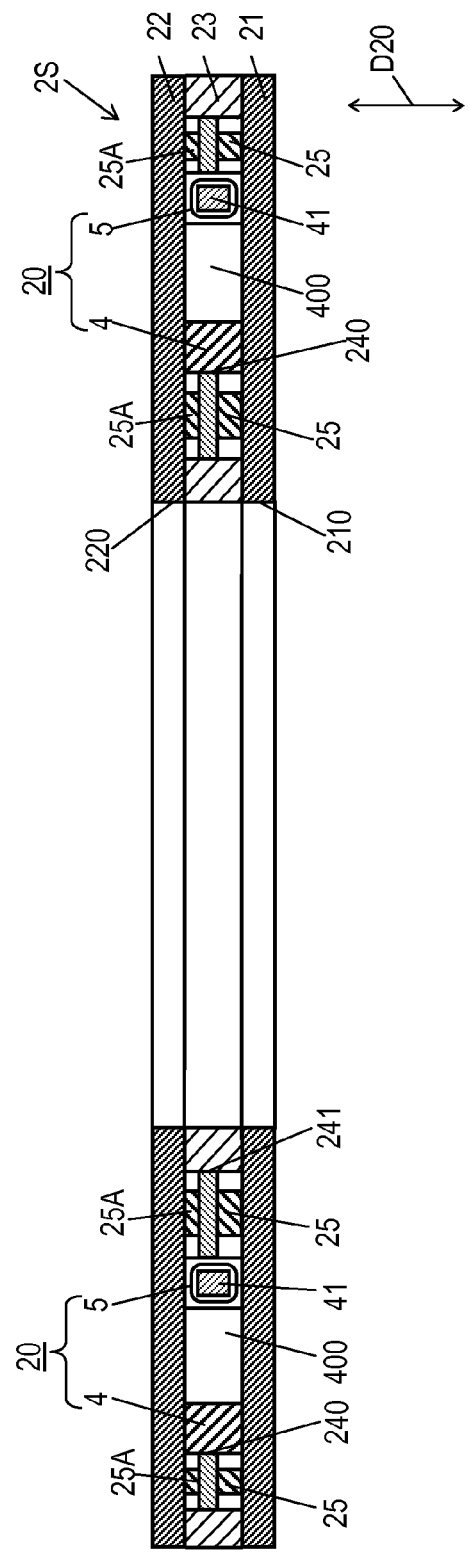
FIG. 23 is a schematic cross-sectional view of a further load sensor according to Embodiment 3.

FIG. 23 is a cross-sectional view of further load sensor 2S according to Embodiment 3. In FIG. 23, components identical to those of load sensor 2L shown in FIG. 16A are denoted by the same reference numerals. Load sensor 2S according to Embodiment 3 includes insulator 25 disposed between board 24 and an outer housing including at least one of first plate 21 and second plate 22. Insulator 25 electrically insulates board 24 from the outer housing. Load sensor 2S may further include insulator 25A disposed between board 24 and plate 22 that is the other of plates 21 and 22. Insulator 25A electrically insulates board 24 from plate 22. The configuration shown in FIG. 23, the outer housing is first plate 21. Insulators 25 and 25A are made of adhesive including, for example, an elastic insulating material. This configuration improves insulation properties between first plate 21 (second plate 22) and board 24 having a circuit, such as detection circuit 3, mounted thereon. This is effective particularly to first plate 21 (Second plate 22) made of metal. This configuration requires neither a spacer for ensuring the insulation distance between board 24 and one of first plate 21 (second plate 22) nor a bolt for fixing the spacer, thus preventing load sensor 2S from having a large size.

Insulators 25 and 25A may be an insulating sheet made of insulating material, or a coating agent including an insulating material and applied to one of the surfaces of board 24. It can be determined arbitrarily whether or not load sensor 2S includes insulators 25 and 25A. For example, in the case that board 24 does not have a circuit, such as detection circuit 3, thereon, load sensor 2S does not necessarily include insulator 25.

Figure 24A:
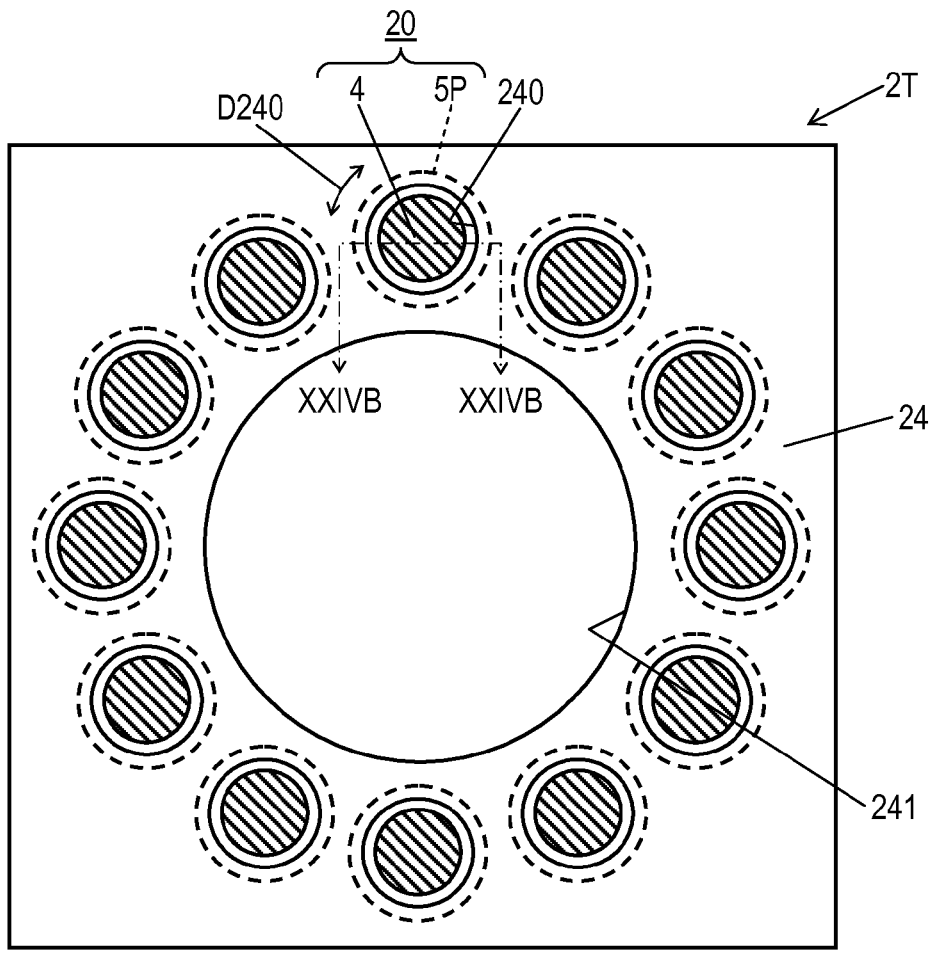
FIG. 24A is a schematic plan view of a further another load sensor according to Embodiment 3.
Figure 24B:
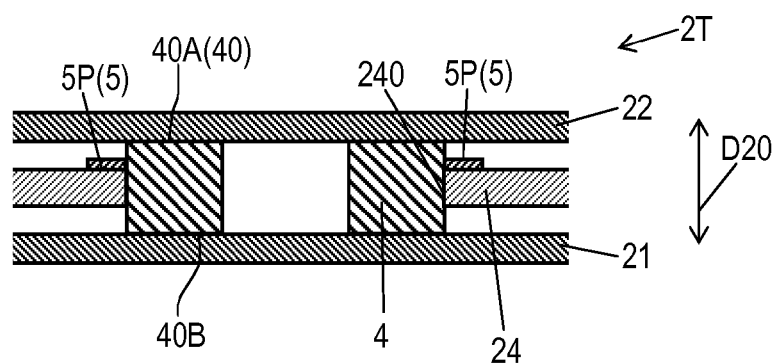
FIG. 24B is a schematic cross-sectional view of the load sensor at line XXIVB-XXIVB shown in FIG. 24A.

FIG. 24A is a plan view of further load sensor 2T according to Embodiment 3. FIG. 24B is a cross-sectional view of load sensor 2T at line XXIVB-XXIVB shown in FIG. 24A. In FIGS. 24A and 24B, components identical to those of load sensor 2L shown in FIGS. 16A and 16B are denoted by the same reference numerals. In load sensor 2T, coil 5 does not include lead wire 5W wound around core 4 but includes conductor 5P. Conductor 5P surrounds a circumferential direction of positioning hole 240 provided in board 24 and extends along circumferential direction D240 of positioning hole 240. Coil 5 (conductor 5P) is formed on the upper surface or the lower surface of board 24.

Figure 24C:
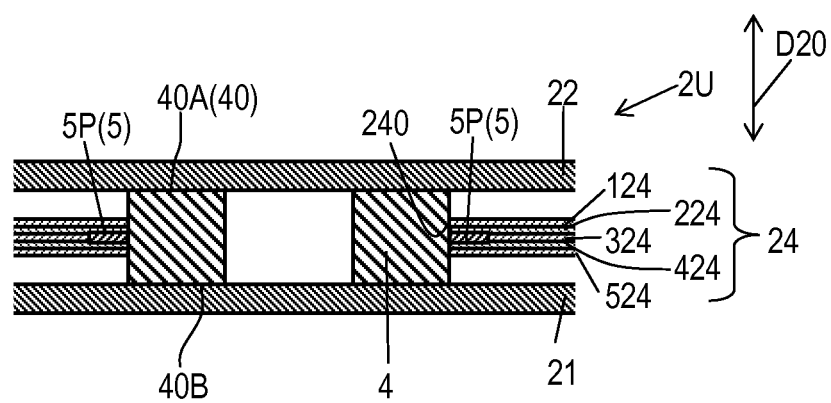
FIG. 24C is a schematic cross-sectional view of a further load sensor according to Embodiment 3.

FIG. 24C is a cross-sectional view of further load sensor 2U according to Embodiment 3. In FIG. 24C, components identical to those of load sensor 2T shown in FIGS. 24A and 24B are denoted by the same reference numerals. In load sensor 2U, board 24 is a multi-layer board including layers 124, 224, 324, 424, and 524. Conductor 5P of coil 5 is formed on layer 324 out of layers 124, 224, 324, 424, and 524.

In load sensors 2T and 2U, since board 24 has coils 5, it is not necessary to wind lead wire 5W around cores 4. Thus, cores 4 do not necessarily have a thickness necessary for winding lead wire 5W, and can be thinner. Since lead wire 5W is not wound around core 4, core 4 does not necessarily have hollow part 400 therein. However, core 4 may have hollow part 400 therein.

Figure 25:
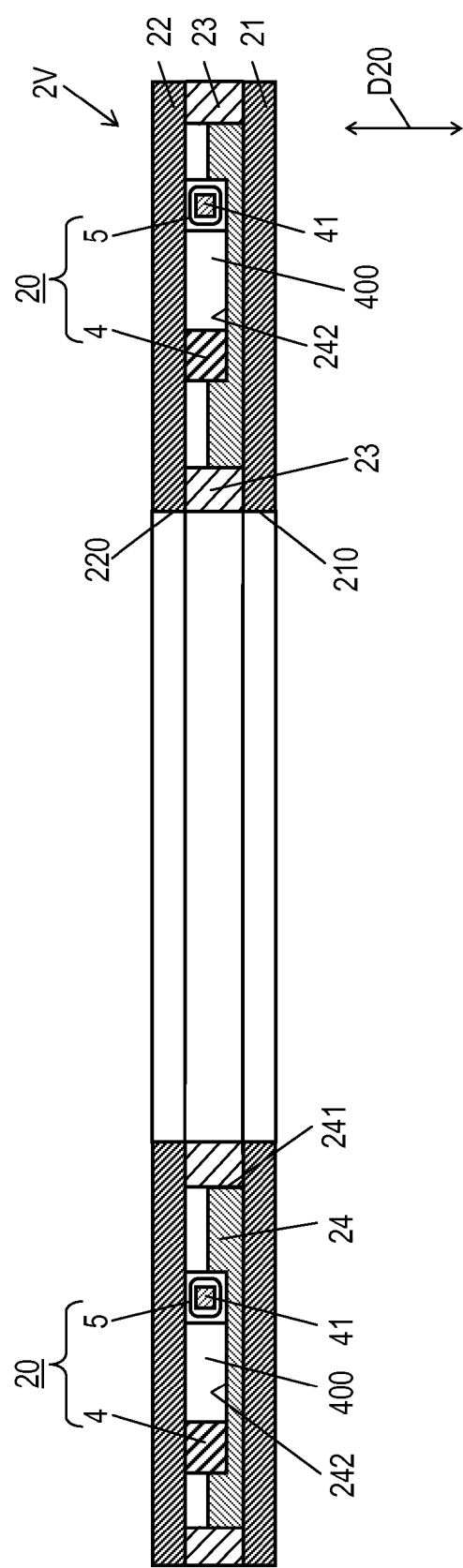
FIG. 25 is a schematic cross-sectional view of a further load sensor according to Embodiment 3.

FIG. 25 is a cross-sectional view of further load sensor 2V according to Embodiment 3. In FIG. 25, components identical to those of load sensor 2L shown in FIGS. 16A and 16B are denoted by the same reference numerals. In load sensor 2V shown in FIG. 25, board 24 has recess 242 in the upper surface of board 24 instead of positioning hole 240. Recess 242 has only a shape core 4 fits, and the opening of recess 242 may have a circular shape or other shapes in a plan view. In load sensor 2V, core 4 can be positioned at a predetermined position by disposing core 4 in recess 242. Load sensor 2J according to Embodiment 2 may have recess 242 in board 24, instead of positioning holes 240.

Figure 26:
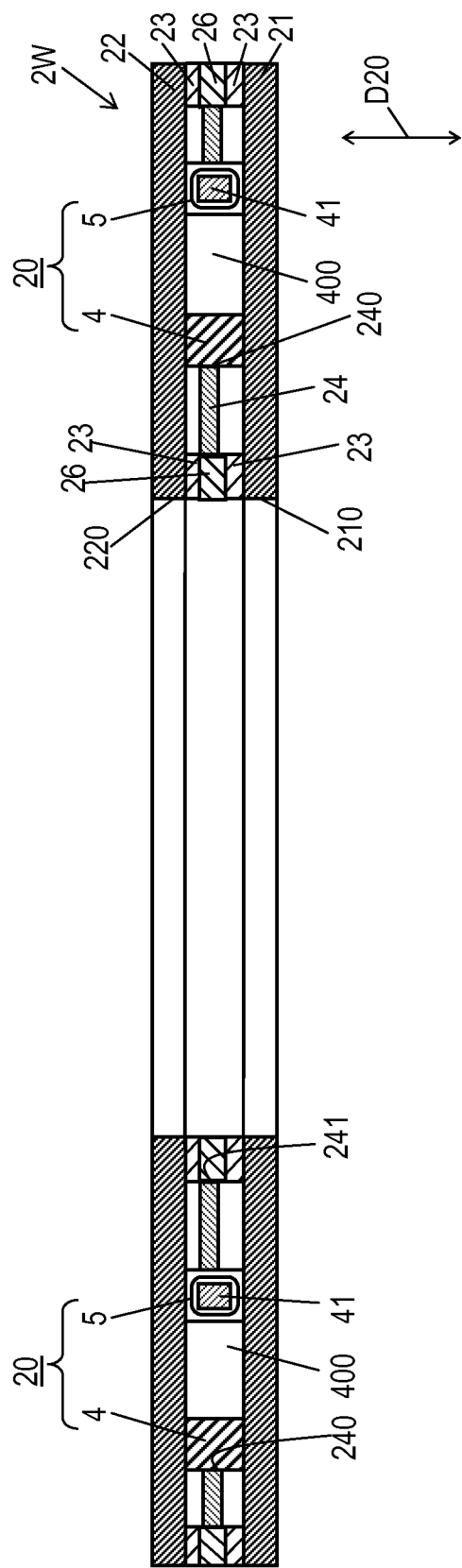
FIG. 26 is a schematic cross-sectional view of a further load sensor according to Embodiment 3.

FIG. 26 is a cross-sectional view of further load sensor 2W according to Embodiment 3. In FIG. 26, components identical to those of load sensor 2L shown in FIGS. 16A and 16B are denoted by the same reference numerals. Load sensor 2W according to Embodiment 3 includes rigid bodies 26 and elastic bodies 23 sandwiching rigid body 26 from both sides in the vertical direction (detecting direction D20). Rigid body 26 is made of material, such as a metal, having higher rigidity than elastic body 23. In load sensor 2W, strength of elastic body 23 against a load can be increased more than a load sensor excluding rigid bodies 26. The thickness of rigid body 26 is preferably adjustable according to the thickness of core 4. In load sensor 2W shown in FIG. 26, rigid body 26 is provided between elastic bodies positioned outside of detecting units 20. Rigid bodies 26 may be provided between elastic bodies 23 provided at an inside.

Figure 27A:
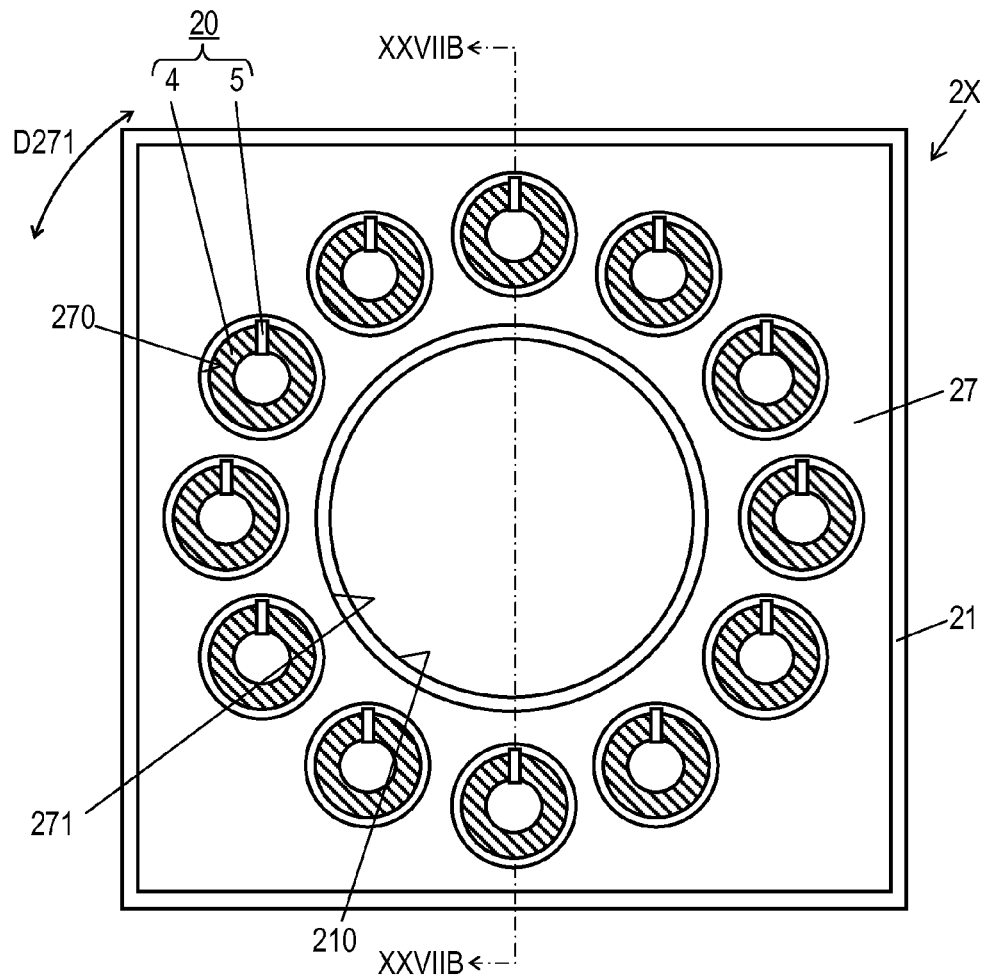
FIG. 27A is a schematic plan view of a further load sensor according to Embodiment 3.
Figure 27B:
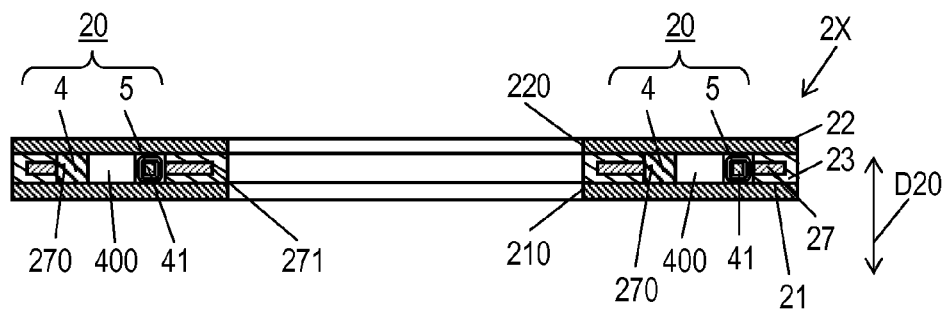
FIG. 27B is a schematic cross-sectional view of the load sensor at line XXVIIB-XXVIIB shown in FIG. 27A.

FIG. 27A is a plan view of further load sensor 2X according to Embodiment 3. FIG. 27B is a cross-sectional view of load sensor 2X at line XXVIIB-XXVIIB shown in FIG. 27A. In FIGS. 27A and 27B, components identical to those of load sensor 2L shown in FIGS. 16A and 16B are denoted by the same reference numerals. In load sensor 2X, structural component 27 positions cores 4, similarly to load sensor 2K shown in FIG. 15, instead of board 24 of load sensor 2L shown in FIGS. 16A and 16B. FIG. 27A does not illustrate second plate 22 and elastic body 23. Structural component 27 is accommodated in a space surrounded by first plate 21, second plate 22, and elastic body 23. Structural component 27 is fixed by allowing elastic body 23 to fill a part of the space.

Structural component 27 has a square shape in a plan view similarly to board 24. As illustrated in FIG. 27A, structural component 27 has aperture 271 at the center thereof. Aperture has a circular shape in a plan view. Aperture 271 has a slightly larger diameter (for example, 140 mm) than apertures 210 and 220. Aperture 271 has a shape allowing a shank of a bolt or tendon 102A to pass through, similarly to apertures 210 and 220. Structural component 27 has (twelve according to Embodiment 3) positioning holes 270 around aperture 271, as illustrated in FIG. 27A. Positioning holes 270 have circular shapes in a plan view, and arranged around aperture 271 along circumferential direction D271 of aperture 271 at equal intervals. The shapes of positioning holes 270 in a plan view are not necessarily circular, but they may be, for example, rectangular as long as cores 4 fit into positioning holes 270.

In this configuration, structural component 27 does not include any circuit, such as detection circuit 3, of load sensor 2X, the size of structural component 27 in the thickness direction can be smaller than the size of board 24, providing load sensor 2X with a small thickness, similarly to load sensor 2J.

Figure 28A:
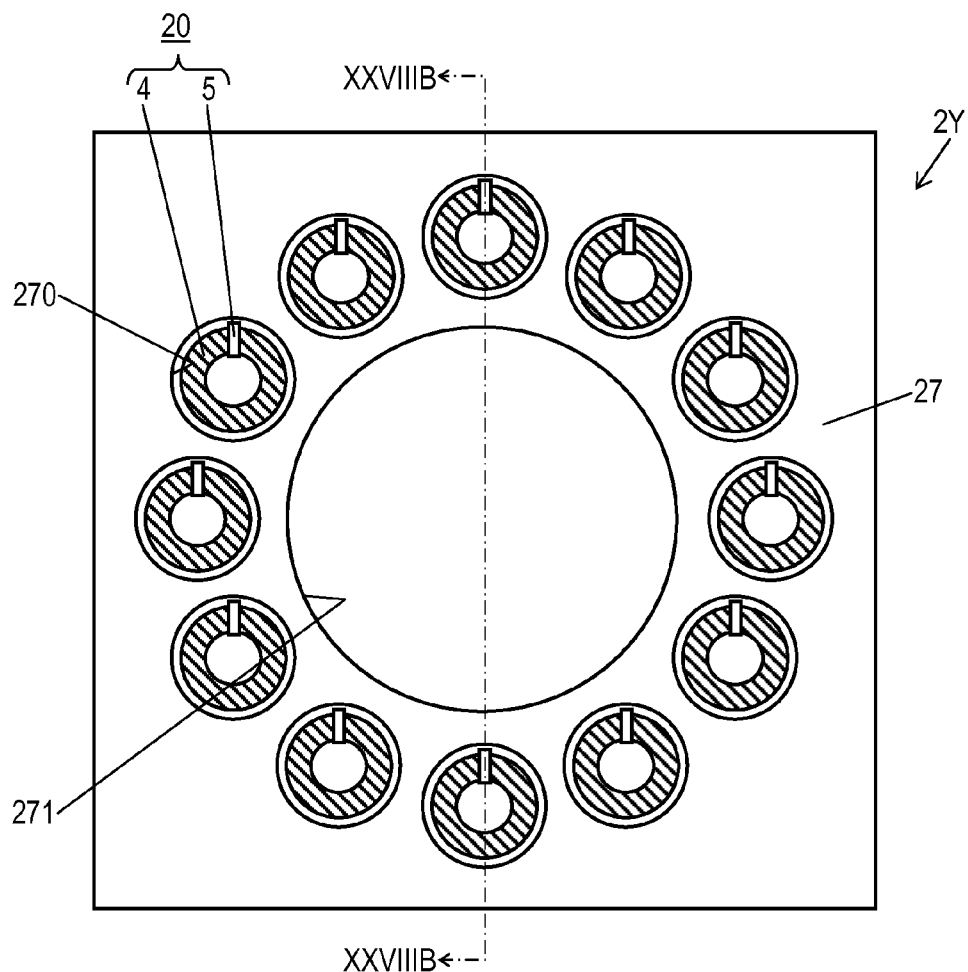
FIG. 28A is a schematic plan view of a further load sensor according to the Embodiment 3.
Figure 28B:
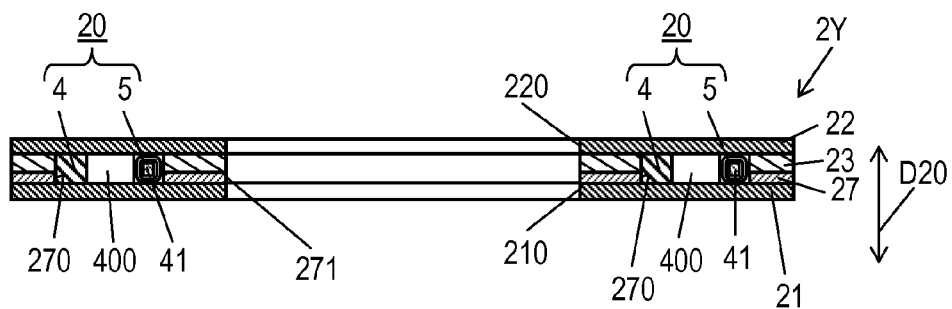
FIG. 28B is a schematic cross-sectional view of the load sensor at line XXVIIIB-XXVIIIB shown in FIG. 28A.

FIG. 28A is a plan view of further load sensor 2Y according to Embodiment 3. FIG. 28B is a cross-sectional view of load sensor 2Y at line XXVIIIB-XXVIIIB shown in FIG. 28A. In FIGS. 28A and 28B, components identical to those of load sensor 2X shown in FIGS. 27A and 27B are denoted by the same reference numerals. In load sensor 2Y, structural component 27 is integrated with one of first plate 21 and second plate 22 as shown in FIGS. 28A and 28B. FIG. 28A does not illustrate second plate 22 and elastic body 23. Structural component 27 is integrated with one of first plate 21 and second plate 22 by using a processing technique, such as welding, and thus, load sensor 2Y can be thinner.

It can be determined arbitrarily whether or not the load sensors according to Embodiment 3 include board 24 or structural component 27, similarly to the load sensors according to Embodiment 2. In other words, in the load sensors according to Embodiment 3, as long as cores 4 can be positioned with first plate 21, second plate 22, and elastic body 23, the load sensors do not necessarily include board 24 or structural component 27. Board 24 and structural component 27 allows the load sensors according to Embodiment 3 not to require a structural component for positioning cores 4 by processing first plate 21 and second plate 22. This can reduce the thicknesses of first plate 21 and second plate 22.

What is claimed is:

1. A load sensor comprising:
   a core having a hollow part provided therein, the core comprising magnetic material; and
   a coil attached to the core;
   a first plate and a second plate that sandwich the core; and
   an elastic body positioning the first plate and the second plate, the elastic body comprising material having an elasticity value smaller than an elasticity value of the core,
   wherein a magnetic path along which a magnetic flux generated by a current flowing in the coil is formed along a circumference direction of the hollow part,
   wherein the core has a load-receiving portion that receives a load at a surface of the core located in a crossing direction crossing a plane along which the magnetic path is formed, and
   wherein the first plate and the second plate sandwiches the core in the crossing direction.

2. The load sensor according to claim 1,
   wherein the core includes an attachment part having the coil attached thereto and a part which has the load-receiving portion and which is different from the attachment part,
   wherein the attachment part of the core has a size in the crossing direction is smaller than a size of the part of the core which has the load-receiving portion and which is different from the attachment in the crossing direction, and
   wherein the size of the attachment part in the crossing direction allows the coil to fit within a width of the part of the core which has the load-receiving portion and which is different from the attachment in the crossing direction.

3. The load sensor according to claim 2, further comprising a protecting part that covers the coil from a side of the load-receiving portion in the crossing direction.

4. The load sensor according to claim 1, further comprising a structural component that is disposed between the first plate and the second plate, and positions the core.

5. The load sensor according to claim 4,
   wherein the structural component includes a positioning hole passing through the structural component in the crossing direction, and
   wherein the core is disposed in the positioning hole.

6. The load sensor according to claim 4, wherein the structural component comprises a board having a circuit mounted thereto.

7. The load sensor according to claim 6, further comprising an insulator that is disposed between the board and an outer housing including at least one of the first plate and the second plate, the insulator electrically insulating the board from the outer housing.

8. The load sensor according to claim 6, wherein the board includes a plurality of laminated layers and a conductor that is provided at one of the plurality of laminated layers, and the conductor constitutes the coil.

9. The load sensor according to claim 1, further comprising a shield that comprises metal and covers at least a part of the core.

10. The load sensor according to claim 1, wherein the core and the coil are disposed to form an open magnetic path when the current flows through the coil.

11. The load sensor according to claim 1, wherein the core and the coil are disposed to form a closed magnetic path when the current flows through the coil.

12. A load detector comprising:
    the load sensor according to claim 1; and
    a detection circuit that detects, based on a change in an inductance of the coil, the load applied to the load-receiving part.

13. A load detector comprising:
    the load sensor according to claim 1; and
    a detection circuit that detects, based on a change in a conductance of the coil, the load applied to the load-receiving part.

14. A load detecting method, comprising:
    supplying a current to the coil of the load sensor according to claim 1; and
    detecting, based on a change in an inductance of the coil, the load applied to the load-receiving portion in the crossing direction.

15. A load detecting method, the method comprising:
    supplying a current to the coil of the load sensor according to claim 1; and
    detecting, based on change in a conductance of the coil, the load applied to the load-receiving portion in the crossing direction.

16. The load sensor according to claim 1, wherein the core is configured to receive a load in a direction along the crossing direction.

17. The load sensor according to claim 1, wherein a space is provided around the coil in the crossing direction so that the load is not applied to the coil.

18. The load sensor according to claim 1,
wherein the core includes an attachment part having the coil attached thereto,
wherein the attachment part of the core has a thickness in the crossing direction smaller than a thickness of a remaining part of the core in the crossing direction so that the load is not applied to the coil, and
wherein the thickness of the attachment part in the crossing direction allows the coil to fit within the thickness of the remaining part of the core.

19. A load sensor comprising:
a core having a hollow part provided therein, the core comprising magnetic material;
a coil attached to the core; and
a bobbin attached to a part of the core,
wherein a magnetic path along which a magnetic flux generated by a current flowing in the coil is formed along a circumference direction of the hollow part,
wherein the core has a load-receiving portion that receives a load at a surface of the core located in a crossing direction crossing a plane along which the magnetic path is formed,
wherein the core has a gap provided in a part of the core in the circumferential direction,
wherein the bobbin is attached to the core to cover the gap, and
wherein the coil includes a lead wire wound around the core via the bobbin.

20. A load sensor comprising:
one or more detecting units each including a core and a coil magnetically coupled to the core, the core being made of magnetic material;
a first plate and a second plate that sandwich the one or more detecting units in a detecting direction between the first plate and the second plate; and
an elastic body positioning the first plate and the second plate, the elastic body comprising material having an elasticity value smaller than an elasticity value of the core,
wherein the one or more detecting units are configured to receive a load applied from the first plate and the second plate in the detecting direction.

21. The load sensor according to claim 20,
wherein the one or more detecting units comprise a plurality of detecting units each including the core and the coil, and
wherein the plurality of detecting units are arranged along a plane perpendicular to the detecting direction.

22. The load sensor according to claim 21, wherein the plurality of detecting units are arranged symmetrically to each other with respect to a reference line on the plane or with respect to a reference point on the plane.

23. The load sensor according to claim 21,
wherein each of the first plate and the second plate has an aperture therein that passes through respective one of the first plate and the second plate in the detecting direction, and
wherein the plurality of detecting units are arranged around the aperture.

24. The load sensor according to claim 21, wherein each of the plurality of detecting units is disposed corresponding to respective one of two or more detection positions out of a plurality of detection positions.

25. The load sensor according to claim 21, wherein the core of each of the plurality of detecting units has an equal size in the detecting direction.

26. The load sensor according to claim 20, further comprising a structural component disposed between the first plate and the second plate for positioning the one or more detecting units.

27. The load sensor according to claim 26,
wherein the structural component has a positioning hole therein passing through the structural component in the crossing direction, and
wherein the core is disposed in the positioning hole.

28. The load sensor according to claim 26, wherein the structural component comprises a board having a circuit mounted thereto.

29. The load sensor according to claim 28, further comprising an insulator disposed between the board and an outer housing including at least one of the first plate and the second plate, the insulator electrically insulating the board from the outer housing.

30. The load sensor according to claim 28, wherein the board includes a plurality of laminated layers and a conductor that is provided at one of the plurality of laminated layers, and the conductor constitutes the coil.

31. The load sensor according to claim 20, wherein the core and the coil are disposed to form an open magnetic path when a current flows through the coil.

32. The load sensor according to claim 20, wherein the core and the coil are disposed to form a closed magnetic path when a current flows through the coil.

33. The load sensor according to claim 20,
wherein the core has a hollow part provided therein,
wherein a magnetic path through which a magnetic flux generated by a current flowing in the coil is formed along a circumference direction of the hollow part, and
wherein the core has a load-receiving portion that receives the load at a surface of the core located in a crossing direction crossing a plane along which the magnetic path is formed.

34. The load sensor according to claim 33,
wherein the core includes an attachment part having the coil attached thereto and a part which has the load-receiving portion and which is different from the attachment part,
wherein the attachment part of the core having the coil attached thereto has a size in the crossing direction is smaller than a size of the part of the core which has the load-receiving portion and which is different from the attachment in the crossing direction, and
wherein the size of the attachment part in the crossing direction allows the coil to fit within a width of the part of the core which has the load-receiving portion and which is different from the attachment in the crossing direction.

35. The load sensor according to claim 34, further comprising a protecting part that covers the coil from a side of the load-receiving portion in the crossing direction.

36. A load detector comprising:
the load sensor according to claim 20; and
a detection circuit that detects the load based on change in a magnetic property of the coil.

37. A load sensor comprising:
a core having a hollow part provided therein, the core comprising magnetic material; and
a coil attached to the core, wherein a magnetic path along which a magnetic flux generated by a current flowing in the coil is formed along a circumference direction of the hollow part, wherein the core has a surface parallel to a plane along which the magnetic path is formed, wherein the surface of the core has a load-receiving portion that receives a load, wherein the core includes an attachment part having a recess falling from the load-receiving portion, and wherein the coil is provided at the attachment part such that the coil does not protrude from the load-receiving portion of the surface of the core.

* * * * *